United States Patent [19]

Harada et al.

[11] Patent Number: 5,712,509
[45] Date of Patent: Jan. 27, 1998

[54] SEMICONDUCTOR INTEGRATED CIRCUIT INTERCONNECTION STRUCTURES

[75] Inventors: Shigeru Harada; Kenji Kishibe; Akira Ohisa; Hiroshi Mochizuki; Eisuke Tanaka, all of Itami, Japan

[73] Assignee: Mitsubishi Denki Kabushiki Kaisha, Tokyo, Japan

[21] Appl. No.: 873,015

[22] Filed: Apr. 24, 1992

[30] Foreign Application Priority Data

May 2, 1991 [JP] Japan ................. 3-100912

[51] Int. Cl.[6] ................. H01L 23/48; H01L 23/52
[52] U.S. Cl. ................. 257/758; 257/750; 257/764; 257/901; 257/904
[58] Field of Search ................. 257/375, 459, 257/488, 60, 61, 62, 430, 451, 901, 904, 928, 741, 750, 764, 765, 758

[56] References Cited

U.S. PATENT DOCUMENTS

| 4,884,123 | 11/1989 | Dixit et al. ................. | 257/764 |
| 5,101,261 | 3/1992 | Maeda ................. | 357/68 |

OTHER PUBLICATIONS

Tomioka et al, "A New Reliability Problem Associated With Ar Ion Sputter Cleaning Of Interconnect Vias", IEEE/IRPS, pp. 53–58.
Nishida et al, "Multilevel Interconnection For Half–Micron ULSI'S", IEEE, VMIC Conference, Jun. 1989, pp. 19–25.
Abe et al, "High Peformance Multilevel Interconnection System With Stacked Interlayer Dieletrics By Plasma CVD And Bias Sputtering", IEEE, VMIC Conference, Jun. 1989, pp. 404–410.

Primary Examiner—Carl W. Whitehead
Attorney, Agent, or Firm—Leydig, Voit & Mayer, Ltd.

[57] ABSTRACT

A semiconductor integrated circuit structure includes a semiconductor substrate; an electronic element disposed in the substrate; a first electrically insulating layer disposed on the substrate and the electronic element; a first electrically conducting interconnection layer electrically connected to the electronic element and disposed at least partly on the first electrically insulating layer; a second electrically insulating layer disposed on the first electrically conducting interconnection layer; a second electrically conducting interconnection layer disposed on the second electrically insulating layer; and a through-hole penetrating the second electrically insulating layer to the first electrically conducting interconnection layer, part of the second interconnection layer being disposed within the through-hole and contacting the first electrically conducting interconnection layer wherein the first electrically conducting interconnection layer includes a current barrier including at least one opening in the first electrically conducting interconnection layer proximate the through-hole extending to the first electrically insulating layer and filled with part of the second electrically insulating layer, constraining current flowing between the first and second electrically conducting interconnection layers to flow around the current barrier.

31 Claims, 38 Drawing Sheets

SEMICONDUCTOR INTEGRATED CIRCUIT INTERCONNECTION STRUCTURES

FIELD OF THE INVENTION

This invention relates to semiconductor integrated circuit interconnection structures and a method of making the interconnection structures. More particularly, the invention relates to interconnection structures interconnecting multiple layers through a via hole.

BACKGROUND OF THE INVENTION

Semiconductor integrated circuits usually include elements, such as transistors, disposed on a substrate. In order to electrically interconnect the elements to each other and/or to other circuits, electrically conducting connecting lines are disposed on the substrate. These connecting lines are made of polycrystalline silicon films, refractory metal films, refractory metal silicide films, refractory metal polycide films, aluminum films, or aluminum alloy films. Since recently developed semiconductor integrated circuits use increasing operating speeds, the electrical resistance of the connecting lines must be decreased. For this reason, multiple level interconnections made of aluminum or aluminum alloy films are popular. A multi-level interconnection employing aluminum films is described in "High Performance Multilevel Interconnection System With Stacked Interlayer Dielectrics By Plasma CVD And Bias Sputtering", by Abe et al, pages 4040–410, VMIC Conference, 1989.

FIG. 35(A) is a plan view and FIG. 35(B) is a cross-sectional view taken along line 35(B)—35(B) of FIG. 35(A) of a multi-level interconnection structure in an integrated circuit. In those figures, a dynamic random access memory (DRAM) cell 2 is a stacked structure disposed on a silicon substrate 1. A first dielectric layer 3 is disposed on the DRAM cell 2. A first electrically conducting interconnection layer 4 is disposed on part of the dielectric layer 3. A second dielectric layer 5 covers the first interconnection layer 4. A through hole 6 penetrates the second dielectric layer 5. A second electrically conducting interconnection layer 7 is disposed on the second dielectric layer 5 and is connected to the first interconnection layer 4 at the through hole 6. A third dielectric layer 8 covers the DRAM cell 2 and the first and second interconnection layers 4 and 7 to prevent moisture from reaching the DRAM cell 2. The second interconnection layer 7 includes a titanium nitride film 9 that directly contacts the second dielectric layer 5 and an aluminum alloy film 10. The stability of the connection between the first and second interconnection layers is important to ensure the reliability of the semiconductor integrated circuit.

A method of making the conventional multi-layer interconnection structure shown in FIGS. 35(A) and 35(B), particularly directed to the formation of the through hole 6, is explained in connection with FIGS. 36–44. In many multi-level interconnection structures, polycrystalline silicon, refractory metals, refractory metal silicides, refractory metal polycides, and aluminum are used in various combinations. However, in the method described below, each of the interconnection layers includes aluminum alloy films.

In FIG. 36, the DRAM cell 2 has already been fabricated and is disposed on the silicon substrate 1. A silicon oxide film 301 disposed on the surface of the substrate 1 electrically isolates the DRAM cell 2. The DRAM cell 2 includes a portion of the silicon oxide layer 301, a transfer gate electrode 302, a doped region 303 within the substrate 1, a word line 304, a storage node 305, a capacitor dielectric layer 306, an electrically conducting cell plate 307, and a dielectric layer 309. The word line 304 is disposed between the silicon oxide layer 301 and the dielectric layer 309. The transfer gate electrode 302 is disposed within the dielectric layer 309. The doped region 303 is disposed beneath part of the storage node 305 as well as in the substrate 1 on the opposite side of the transfer gate electrode 302.

As shown in FIG. 37, the first dielectric layer 3 is deposited on the dielectric layer 309 covering the DRAM cell 2. A contact hole 308 penetrating the first dielectric layer 3 and the dielectric layer 309 adjacent the transfer gate electrode 302 is opened using conventional photolithographic technology. As shown in FIG. 38, the first interconnection layer 4 is deposited on the first dielectric layer 3 and in the contact hole 308. The first interconnection layer 4 includes a titanium nitride (TiN) or a titanium tungsten alloy (TiW) film 310 contacting the first dielectric layer 3 and an aluminum alloy film 311 that may be Al-Si or Al-Si-Cu disposed on the film 310.

In many current semiconductor integrated circuits, structural elements have sub-micron dimensions. In these integrated circuits, the interconnection layers include two films, such as films 310 and 311, for several reasons. First, when aluminum contacts the doped part of the silicon substrate, an abnormal reaction, referred to as an alloy spike, may occur. The alloy spike may penetrate the doped region to the substrate, resulting in current leakage. In order to prevent this reaction, an interconnection layer including two films is employed so that a titanium compound or alloy directly contacts the silicon substrate. Second, silicon in the aluminum alloy film 311 may be grown in solid-phase epitaxy rather than being homogeneously deposited, resulting in poor contacts. To prevent this undesirable growth, the first interconnection layer 4 includes the titanium alloy film 310. Third, dielectric layers are disposed on or near the aluminum interconnection structure. These films apply stress that can cause an aluminum interconnection to become electrically open, an effect called stress migration. The titanium alloy film 310 adjacent the aluminum alloy film 311 has a high resistance to stress migration.

As shown in FIG. 39, the first interconnection layer 4 is patterned by conventional photolithographic technology. After the patterning, as shown in FIG. 40, the second dielectric layer 5 is deposited on the first interconnection layer 4. The second dielectric layer 5 includes a silicon oxide film 321, an inorganic spin-on glass (SOG) film 322, and a second dielectric film 323. The films 321 and 323 are deposited by chemical vapor deposition (CVD). In that CVD method, a mixture of silane ($SiH_4$) and oxygen ($O_2$) or $N_2O$ is employed at a temperature under 300° C. to 450° C. to deposit the dielectric films. Recently, silicon oxide films providing good step coverage have also been prepared using tetraethylorthosilicate (TEOS). The inorganic SOG film 322 is used to flatten the surface of the silicon oxide film 321 and usually includes $Si(OH)_4$ as the principal ingredient. After applying the SOG, the film is baked at a temperature of 400° C. to 450° C. to convert the SOG material into a silicon oxide film. The SOG film 322 is highly hygroscopic so that if the SOG film 322 is exposed on the side wall of the through hole, it may release a gas. For this reason, dry etching is usually employed to form through holes to avoid exposing the surface of the SOG film 322.

As shown in FIG. 41, the through hole 6 is formed using conventional photolithographic technology to expose a portion of the surface of the aluminum alloy film 311 of the first interconnection layer 4. A layer of photoresist 324 is deposited on the silicon oxide film 323 and patterned to expose the area where the through hole 6 is to be formed. Thereafter, a portion of the second dielectric layer 5 comprising the silicon oxide layers 321 and 323 is removed using the tapered etching method. In that method, wet etching with a HF/NH$_4$F solution is followed by reactive ion etching (RIE) in a mixture of CHF$_3$ and oxygen. Subsequently, the photoresist 324 and the products of the etching steps are removed.

During the etching process forming the through hole 6, the surface of the first interconnection layer 4 is exposed to the plasma of CHF$_3$ and oxygen which includes fluorine. As a result, a portion of the aluminum alloy film 311 to a depth of about ten nanometers is contaminated with fluorine and oxygen. In order to remove the thin contaminated layer, layer 251 of FIG. 41, argon sputter etching is carried out, as indicated in FIG. 42. Removal of the contaminated layer 251 produces a more stable contact resistance in the subsequently formed structure. Thereafter, the second interconnection layer 7, including the titanium nitride film 9 and the aluminum alloy film 10, is deposited as shown in FIG. 43. The titanium nitride film 9 resists stress migration that can cause open circuits in the second interconnection layer due to the overlying dielectric layers. The first and second interconnection layers 5 and 7 remain in good contact, providing good resistance against electromigration and stress migration. The aluminum alloy film 10 and the titanium nitride film 9 are patterned using the same photolithographic technology employed for patterning the first interconnection layer 4. After the second interconnection layer 7 is deposited, it is heated at 400° C. to 450° C. in order to establish an electrical contact between the first and second interconnection layers 4 and 7 within the through hole 6.

Finally, referring to FIG. 44, the third dielectric layer 8, which is silicon oxide or silicon nitride, is deposited on the second interconnection layer 7 by CVD to provide moisture protection.

The conventional multi-layer interconnection structure described has a number of problems. As the interconnection is reduced in size, the diameter of the through hole 6 becomes smaller. When that diameter is less than about a micron, the electrical contact formed by way of the through hole 6 can become unstable or unreliable. FIG. 45(A) is a plan view of a contact in a double layer interconnection. FIG. 45(B) is a cross-sectional view taken along line 45(B)—45(B) of FIG. 45(A). In that structure, a first narrow interconnection 12 is connected to a second thin interconnection 14 through a through hole 16, all at the right side of FIGS. 45(A) and 45(B). On the left side of FIGS. 45(A) and 45(B), corresponding to a buffer circuit or a battery circuit connected to a memory cell or logic circuit, the first interconnection layer 4 is connected to a second thin interconnection 15 at a through hole 17. The interconnection structure incorporating the through hole 17 provides a less reliable electrical connection than the interconnection structure employing the through hole 16. Referring to FIGS. 46(A) and 46(B), the current I1 flows from the first interconnection layer 4 to the second thin interconnection 15 through the through hole 17. A void 201 may be produced in the first interconnection layer 4 at the through hole 17 by electromigration.

Electromigration is explained with respect to FIGS. 47(A)–49(B), plan and section views corresponding to FIGS. 45(A) and 45(B). It is known that the aluminum alloy film 311 has a polycrystalline structure containing randomly disposed minute defects. The quantity of the defects depends upon the conditions of the formation of the aluminum alloy film. As the width of the interconnection increases, the number of defects per unit length increases. When the current I1 flows from the first interconnection layer 4 to the second thinner connection 15 through the through hole 17, electrons 203 flow from the aluminum alloy film 10 to the aluminum alloy 311. The flowing electrons are scattered by grain boundaries 204 in the aluminum films, dislodging aluminum atoms and causing those atoms to migrate. Thus, the minute defects 202 in the aluminum alloy film 311 grow gradually, producing new defects at the locations from which aluminum atoms migrate. As this process is repeated, the defects 202 become larger defects 205. The defects 205 tend to form in clusters and create voids where the carrier mobility of the material changes significantly as compared to the remainder of the material. In the interconnection structure shown in FIGS. 47(A) and 48(A), the large defects 205 gather near the through hole 17 in the film 311.

The mobility of the atoms in the aluminum alloy layer 311 is much larger than the mobility of the atoms in the titanium nitride film 9. A void that is produced by the collection of the defects 202 causes deterioration of the layer 311 adjacent the through hole 17. The likelihood that this defect phenomenon will occur is increased by the large difference between the mobility of atoms in the two materials of the respective films. Moreover, because the number of the defects in the first interconnection layer 4 is larger than the number of defects in the narrow interconnection 12, the void produced at the through hole 17 will be larger than the void produced at the through hole 16.

The effect of the defects on the through hole increases as the size of the through hole decreases. Therefore, the adverse effects of electromigration are reduced when the interconnection is narrower or when the through hole is relatively large in size. In other words, it is more difficult to interrupt an electrical connection at through hole 16 than at through hole 17. Ultimately, an electrical interconnection with a void can completely fail and become electrically open. However, until the electrical interconnection fails, it increases in resistance. Although particular interconnections including two different interconnections, each comprising two different metal films, have been described, the same phenomenon occurs in interconnections so long as different materials are in contact.

In FIGS. 50(A) and 50(B), which are a plan view and a sectional view taken along line 50(B)—50(B) of FIG. 50(A), respectively, the DRAM cell 2 is disposed on the silicon substrate 1. The first dielectric layer 3 is disposed on the DRAM cell 2 and a tungsten polycide interconnection layer 21 is disposed at spaced apart intervals on the first dielectric layer 3. The tungsten polycide interconnection layer 21 includes a film 21a of polycrystalline silicon on which is disposed a tungsten silicide film 21b. The second dielectric layer 5 covers the tungsten polycide interconnection layer 21. The through hole 6 penetrates the second dielectric layer 5. An aluminum interconnection layer 22 is disposed on the second dielectric layer 5 and is connected to the tungsten polycide interconnection layer 21 through the through hole 6. The third dielectric layer 8 covers the DRAM cell 2, the tungsten polycide interconnection layer 21, and the aluminum interconnection layer 22 to prevent moisture from entering the structure.

As shown in FIG. 51, in this structure, a current I3 flows from the wide tungsten polycide interconnection layer 21 at the left side of FIG. 50(A) to the relatively wide aluminum interconnection layer 22 through the small through hole 6. In this case, defects in the aluminum layer 22 move by electromigration and collect at the through hole 6 to produce the void 201. As a result, the interconnection becomes electrically open. The electromigration phenomenon occurs whenever the materials in contact as part of the interconnection are different. In this way, whenever there is a contact interface between different materials, there is a very large difference in the mobility of atoms within the materials as a result of the contact interface. This difference in mobility is of no concern if the through hole is relatively large. However, at sub-micron through hole sizes, the difference in mobility is a serious problem because of the possibility of producing open circuits.

The present invention is directed to solving the problem of increased resistance and open circuits in multi-level interconnections in semiconductor integrated circuits. In particular, it is an object of the invention to provide an interconnection between electrically conducting lines of different materials without producing interconnections of increasing resistance or open circuits, thereby increasing the reliability of an integrated circuit incorporating the interconnection.

SUMMARY OF THE INVENTION

According to one aspect of the invention, a semiconductor integrated circuit structure includes a semiconductor substrate; an electronic element disposed in the substrate; a first electrically insulating layer disposed on the substrate and the electronic element; a first electrically conducting interconnection layer electrically connected to the electronic element and disposed at least partly on the first electrically insulating layer; a second electrically insulating layer disposed on the first electrically conducting interconnection layer; a second electrically conducting interconnection layer disposed on the second electrically insulating layer; and a through-hole penetrating the second electrically insulating layer to the first electrically conducting interconnection layer, part of the second interconnection layer being disposed within the through-hole and contacting the first electrically conducting interconnection layer wherein the first electrically conducting interconnection layer includes a current barrier including at least one opening in the first electrically conducting interconnection layer proximate the through-hole extending to the first electrically insulating layer and filled with part of the second electrically insulating layer, constraining current flowing between the first and second electrically conducting interconnection layers to flow around the current barrier.

According to another aspect of the invention, a method of making a semiconductor integrated circuit interconnection structure includes forming an active electronic element in a semiconductor substrate; forming a first electrically insulating layer on the electronic element and the semiconductor substrate; forming a first electrically conducting interconnection layer electrically connected to the electronic element, at least partially disposed on the first electrically insulating layer, and including at least one opening extending to the first electrically insulating layer; forming a second electrically insulating layer on the first electrically conducting interconnection layer and filling the opening, thereby forming a barrier to the flow of current in a region of the first electrically conducting interconnection layer; forming a through-hole extending through the second electrically insulating layer to the first electrically conducting interconnection layer proximate the opening; and depositing a second electrically conducting interconnection layer on the second electrically insulating layer and in the through-hole, electrically contacting the first electrically conducting interconnection layer.

BRIEF DESCRIPTION OF THE DRAWINGS

FIGS. 13(A)–17(A) are plan views and FIGS. 13(B)–17(B) are corresponding cross-sectional views of an interconnection structure according to an embodiment of the invention illustrating current flows and the migration of defects.

FIGS. 20(A)–34(A) are plan views and FIGS. 20(B)–34(B) are corresponding cross-sectional views of alternative embodiments of multi-level interconnection structures in semiconductor integrated circuits according to embodiments of the invention.

FIGS. 45(A)–51(A) are plan views and FIGS. 45(B)–51(B) are corresponding cross-sectional views of conventional multi-level interconnection structures in semiconductor integrated circuits illustrating the interconnection structure, current flow in the interconnection structure, and electromigration of defects in the interconnection structure.

DETAILED DESCRIPTION OF PREFERRED EMBODIMENTS

Figure 1A:
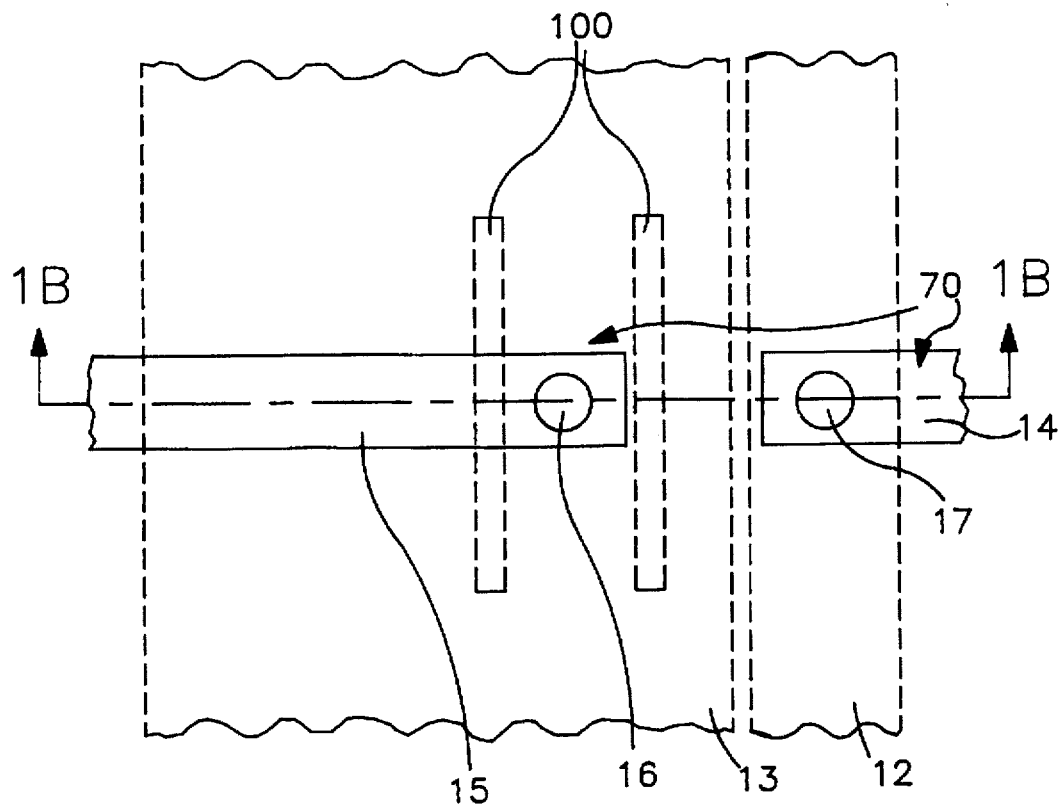
FIGS. 1(A) and 1(B) are plan and sectional views of an interconnection structure in a semiconductor integrated circuit according to an embodiment of the invention.
Figure 1B:
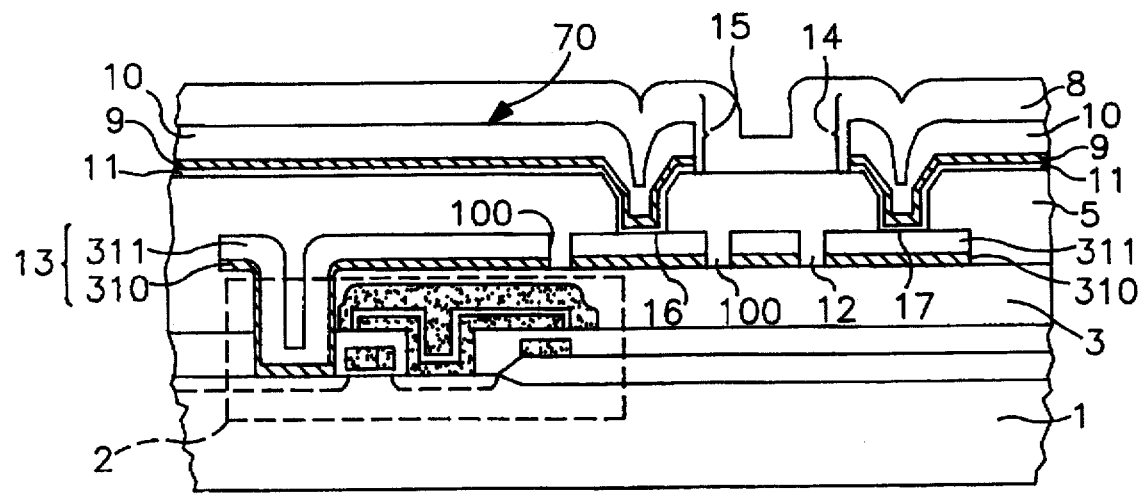

FIG. 1(A) is a plan view and FIG. 1(B) is a cross-sectional view taken along line 1(B)—1(B) of FIG. 1(A) of an interconnection structure in a semiconductor integrated circuit according to the invention. In these and all other figures, like elements are given the same reference numbers. The structure shown in FIGS. 1(A) and 1(B) includes the DRAM cell 2 disposed on the silicon semiconductor substrate 1. A first dielectric layer 3 is disposed on the DRAM cell 2 and a wide interconnection layer 13 is disposed on the first dielectric layer 3. The wide interconnection layer 13 includes a number of elements that are spaced apart from each other at a fixed interval. A second dielectric layer 5 covers the wide interconnection layer 13. A through hole 16 penetrates the second dielectric layer 5 and reaches the wide interconnection layer 13. A second interconnection layer 70 is disposed on the second dielectric layer 5 and is electrically connected to the wide interconnection layer 13 through the through hole 16. A third dielectric layer 8 covers the entire structure to protect it from moisture.

The first interconnection layer 4 includes a titanium nitride or titanium tungsten alloy film 310 and an overlying aluminum alloy film 311. The second interconnection layer 70 includes a titanium film 11, a titanium nitride film 9, an aluminum alloy layer 10. The wide interconnection layer 13, indicated in FIG. 1(A), is electrically connected with the second interconnection layer 15 through a through hole 16. A narrow aluminum interconnection layer 12, indicated in FIG. 1(A), is electrically connected with the second interconnection layer 14 through a through hole 17. The wide interconnection layer 13 includes two electrically insulating barriers 100 that are generally linear and parallel to each other between which the through hole 16 is disposed and which are parts of the second dielectric layer 5. The dielectric material of the barriers 100 channels the flow of current to and from the throughhole 16 along particular directions.

Figure 2:
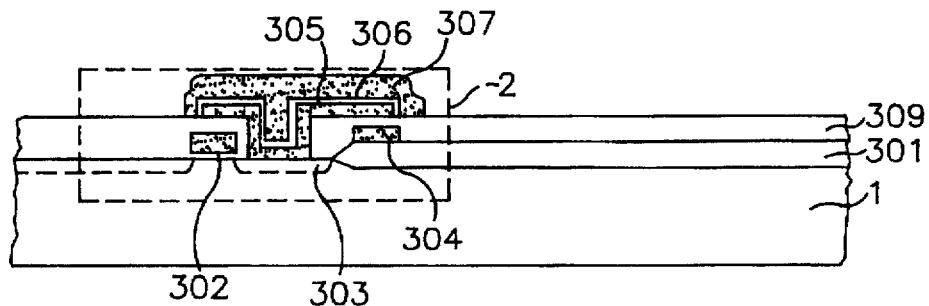
FIGS. 2–10 are sectional views illustrating a method according to an embodiment of the invention for making an interconnection structure in a semi conductor integrated circuit.
Figure 3:
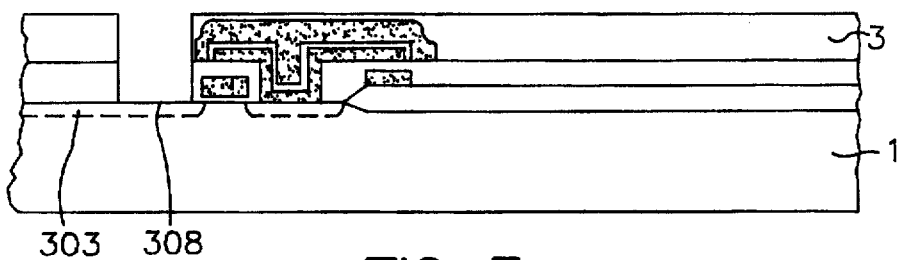
Figure 4:
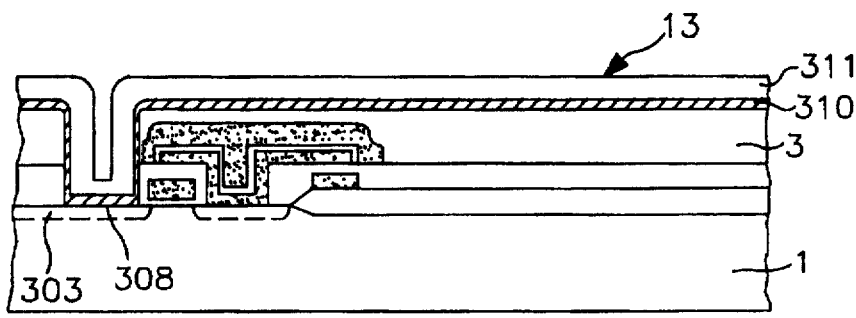
Figure 5:
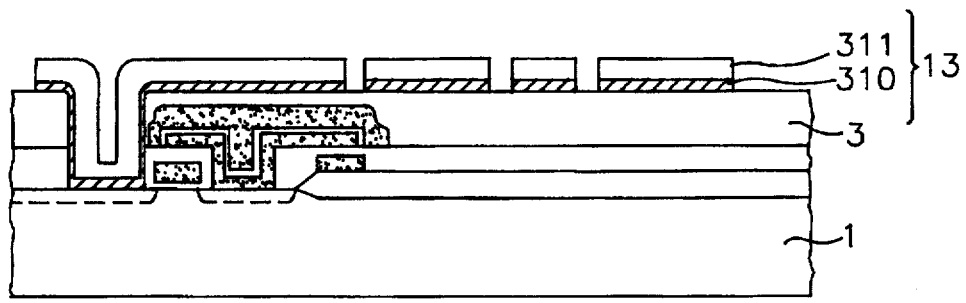
Figure 36:
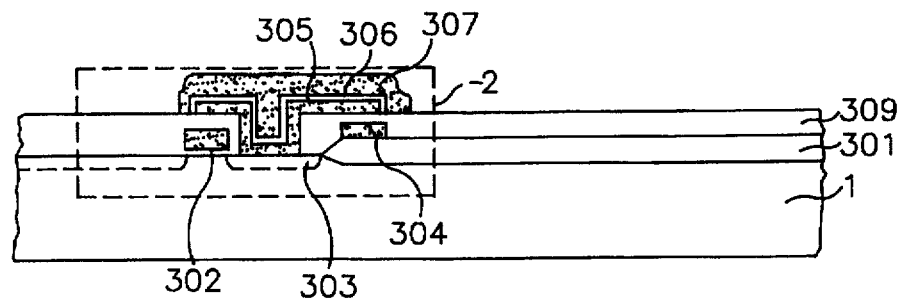
FIGS. 36–44 are cross-sectional views illustrating steps in a method of making the interconnection structure of FIG. 35(A).
Figure 37:
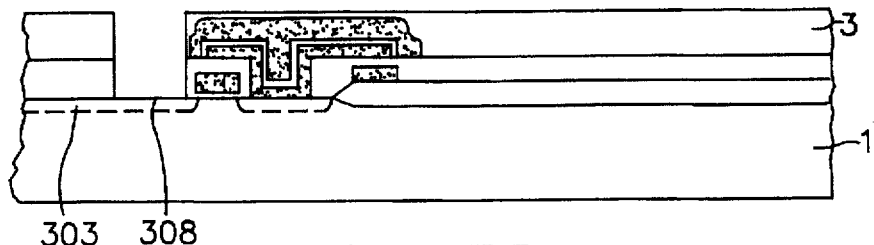
Figure 38:
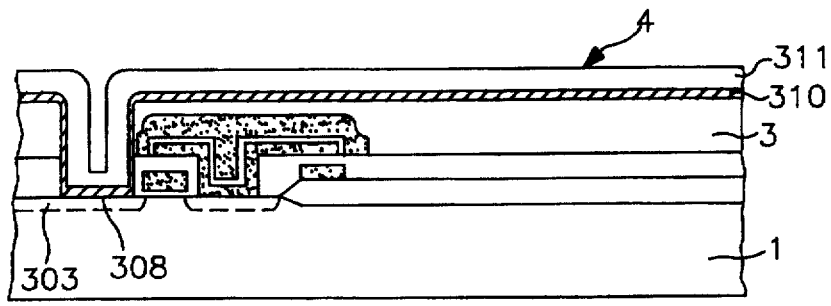
Figure 39:
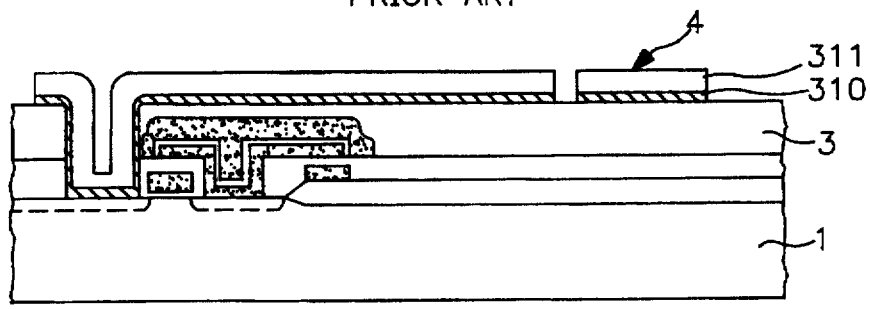

Steps in a method of manufacturing the interconnection structure of FIGS. 1(A) and 1(B) are illustrated in cross-sectional views in FIGS. 2-10. The steps illustrated in FIGS. 2-4 are essentially identical to the steps illustrated in FIGS. 36-38 and, therefore, do not require repeated description. However, the process step illustrated in FIG. 5 is different from the corresponding process step illustrated in FIG. 39. In the step illustrated in FIG. 5, portions of the wide interconnection layer 13 are additionally removed so that the barriers 100 of the completed structure shown in FIG. 1(A) are formed when the second dielectric layer 5 is deposited. Although, in FIG. 5, it appears that the wide interconnection layer 13 is divided into separate parts because of the location of the sectioning plane, it is apparent from FIG. 1(A) that the openings in the wide interconnection layer 13 filled with dielectric material as barriers 100 do not extend indefinitely or cause complete electrical isolation between parts of the wide electrode 13.

Figure 6:
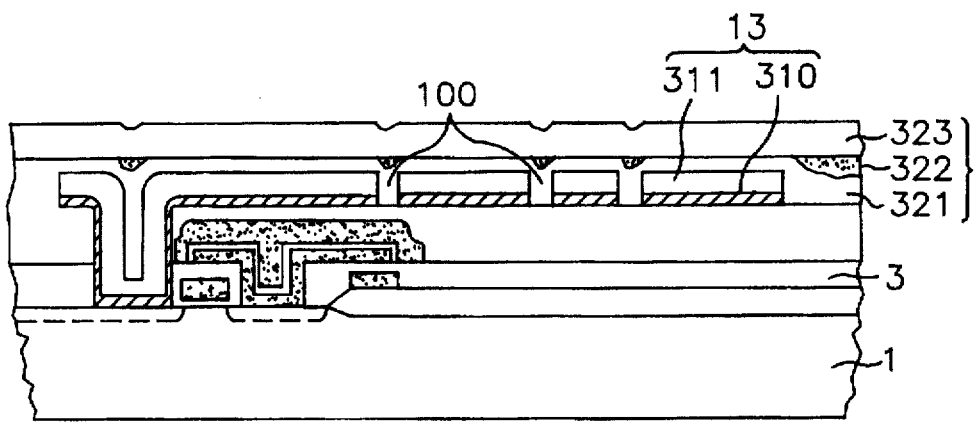
Figure 7:
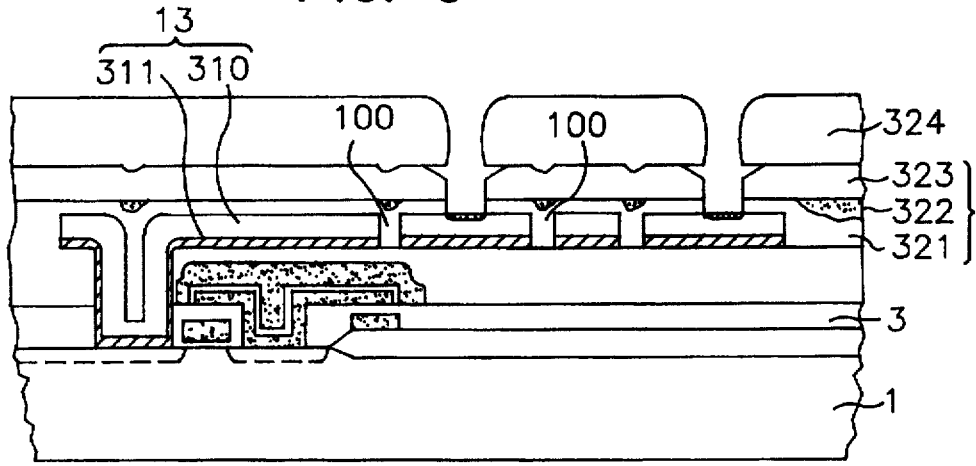
Figure 8:
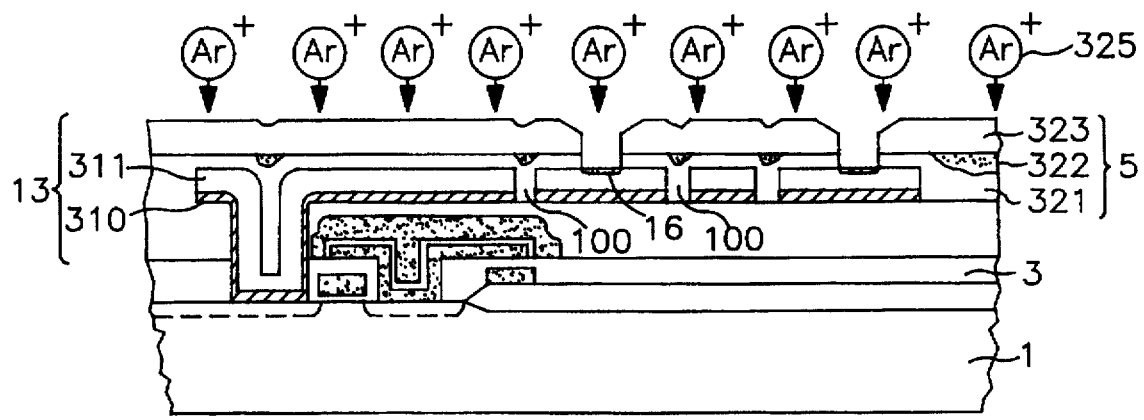
Figure 40:
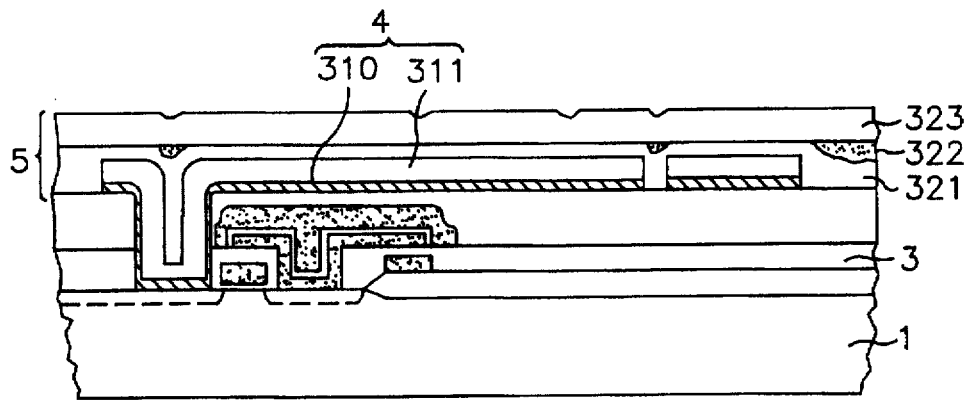
Figure 41:
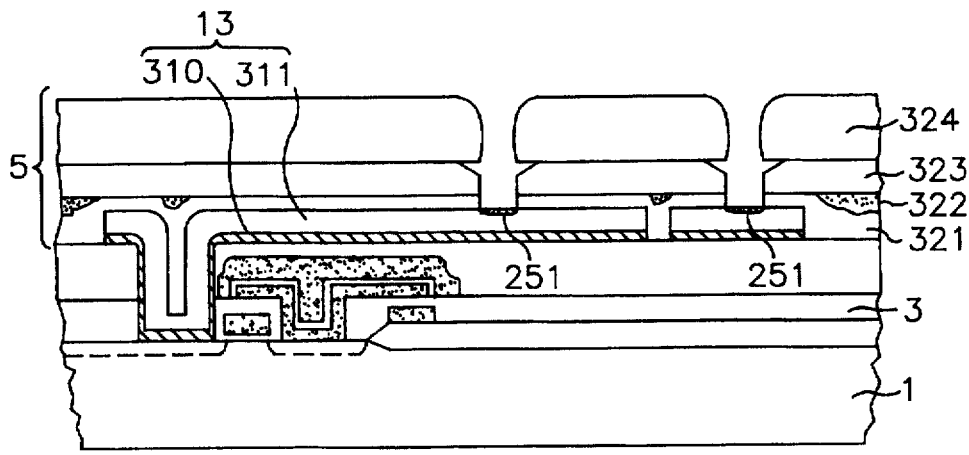
Figure 42:
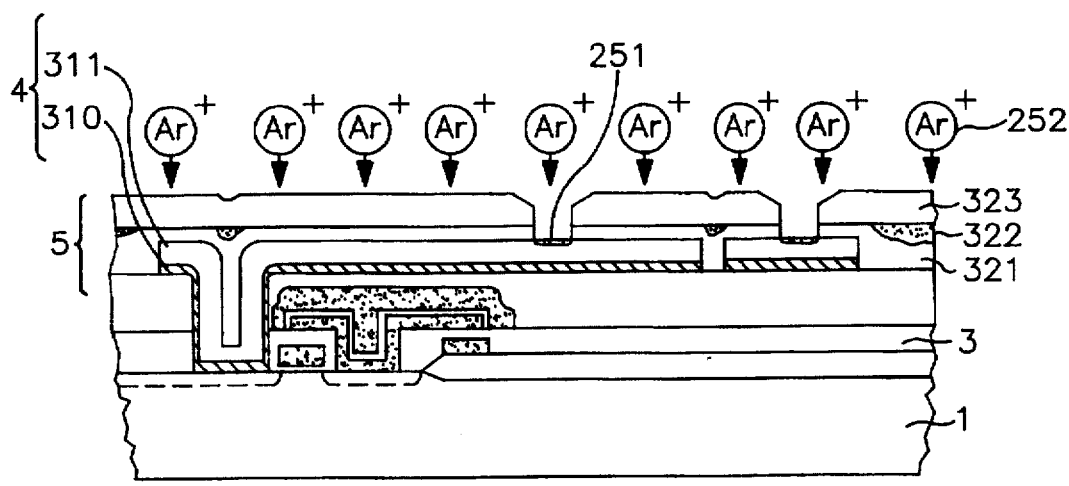

When the films comprising the second dielectric layer 5 are deposited, as shown in FIG. 6, the electrically insulating barriers 100 are formed. The steps in completing the structure illustrated in FIGS. 6-8 are identical to the steps already described with respect to FIGS. 40-42 and, therefore, do not require repeated explanation.

Figure 9:
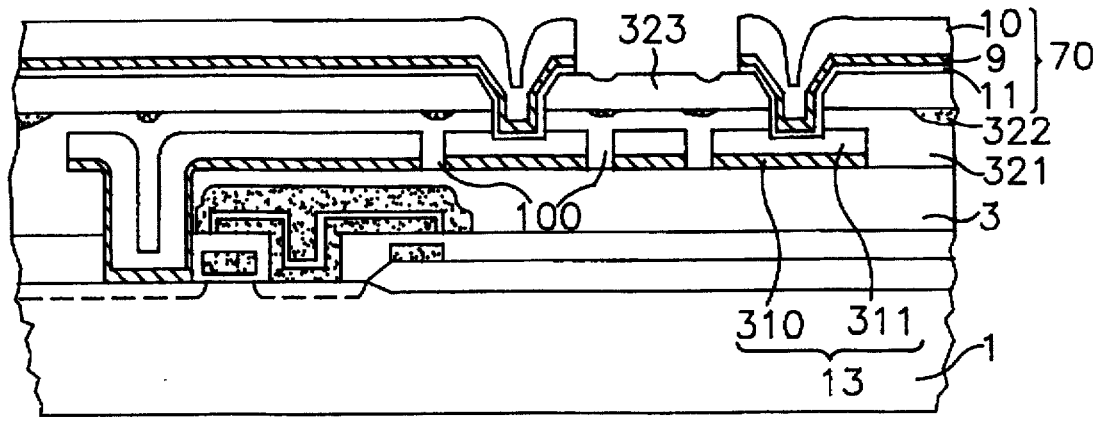
Figure 10:
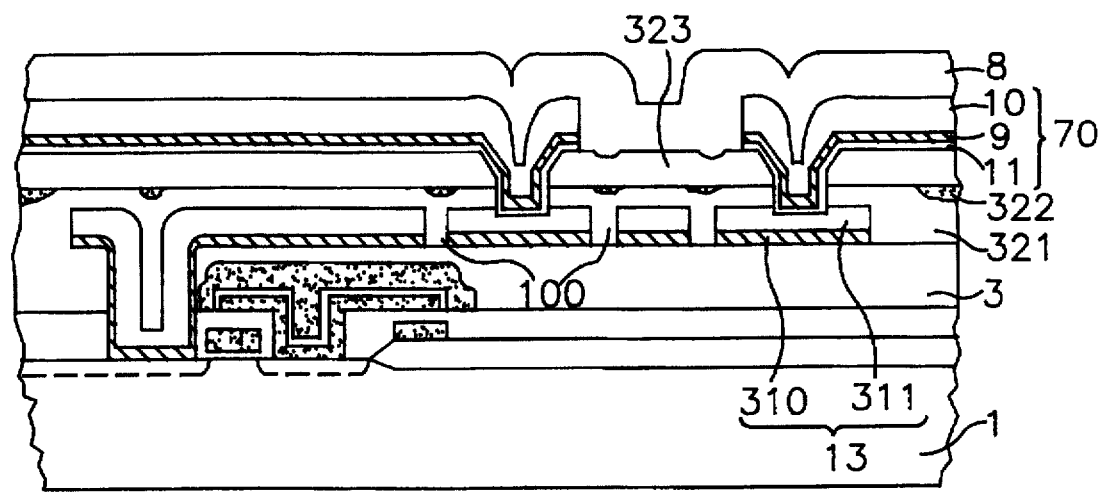
Figure 43:
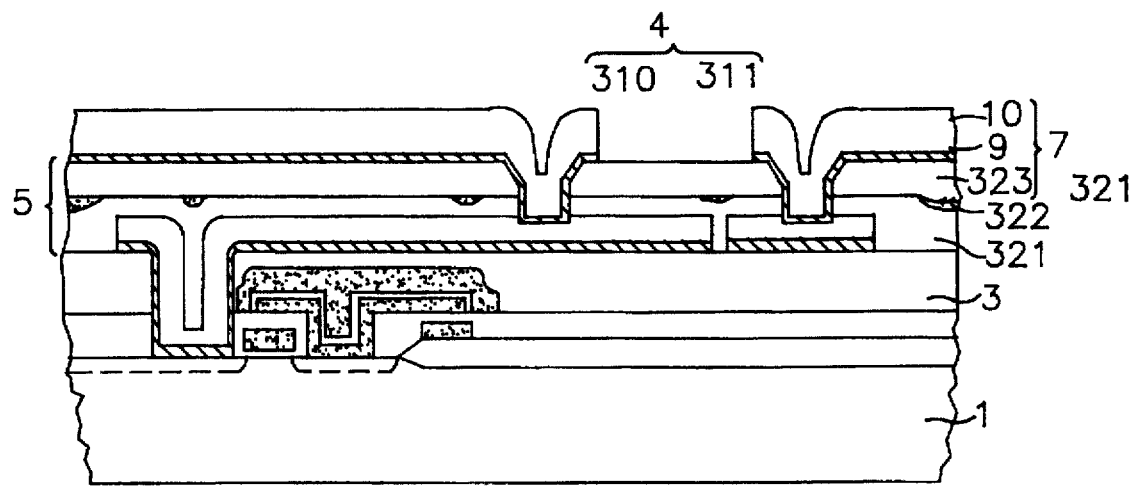
Figure 44:
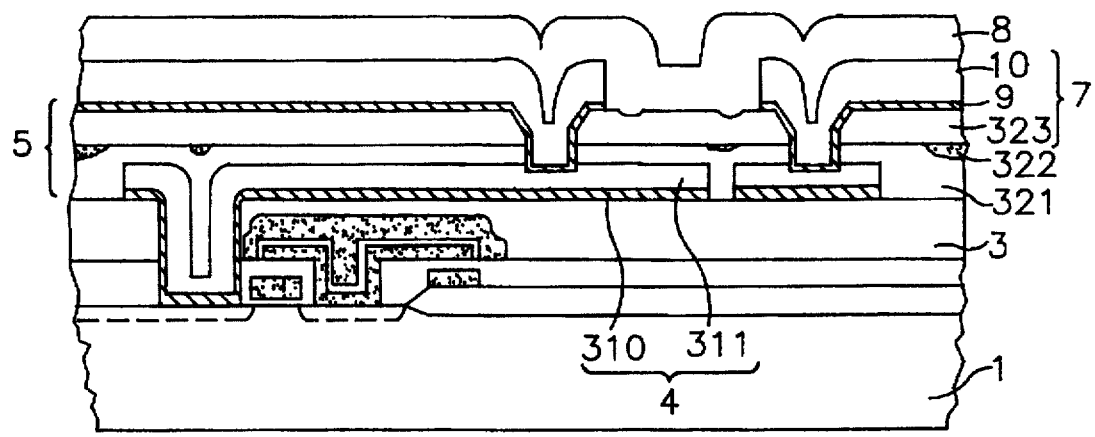
Figure 45A:
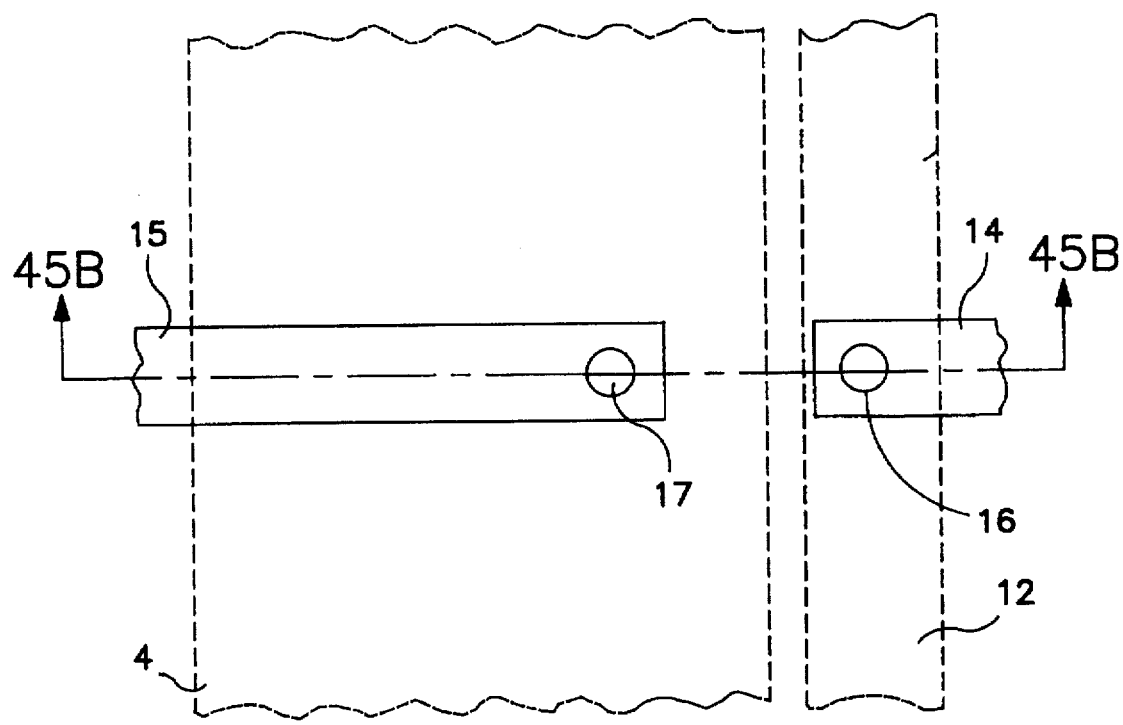
Figure 45B:
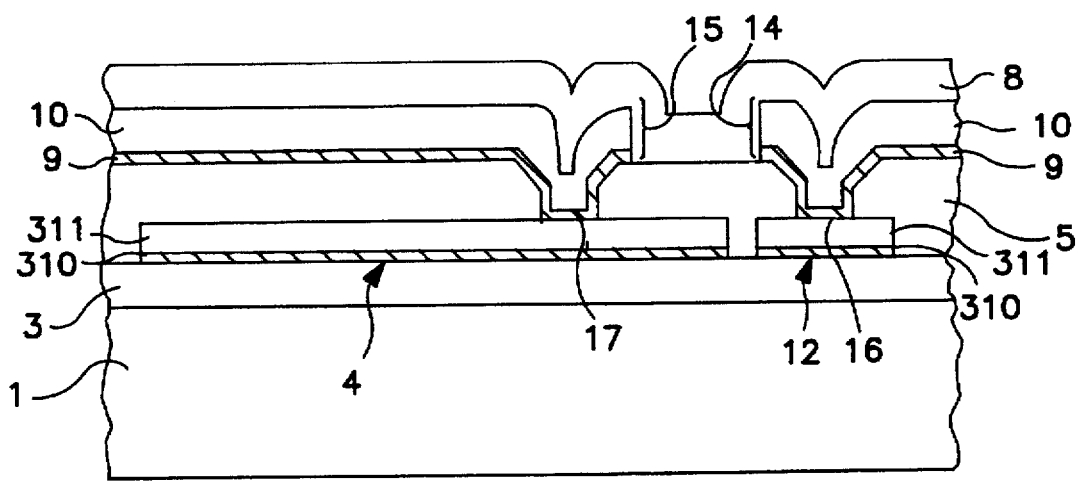
Figure 46A:
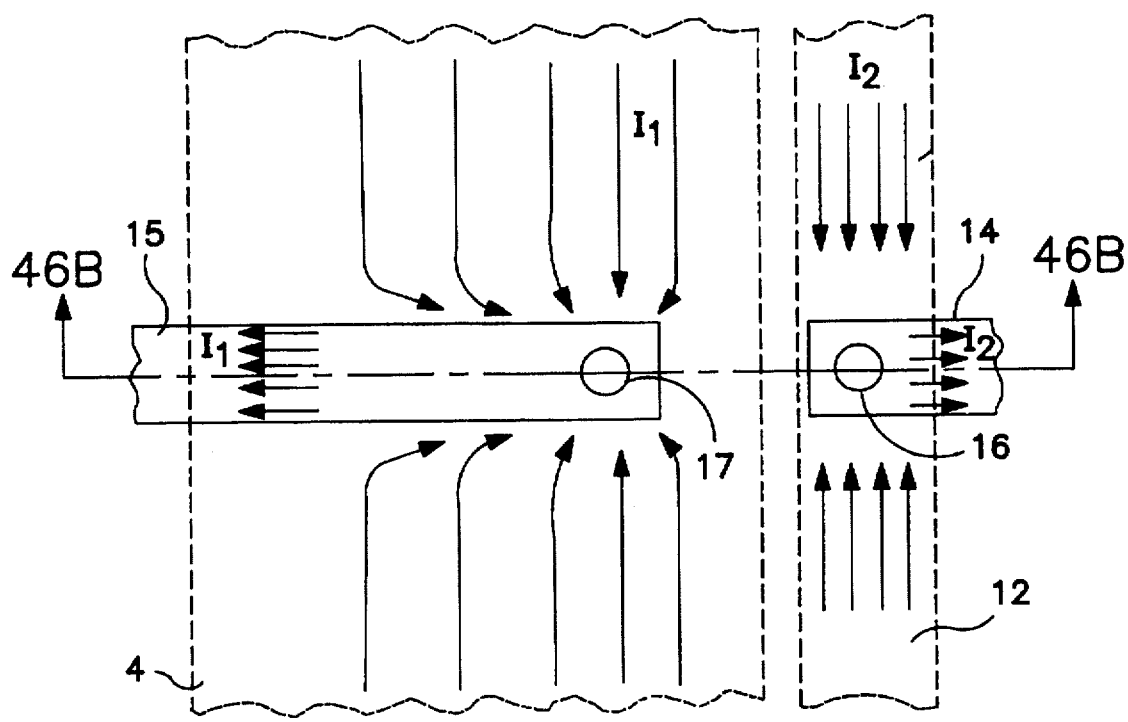
Figure 46B:
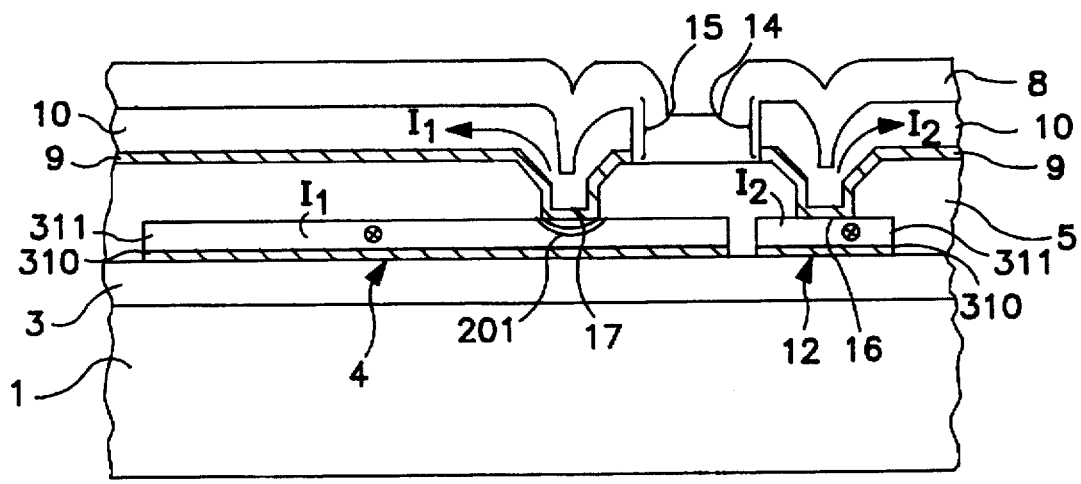

The process of forming the second interconnection layer 70 illustrated in FIG. 9 differs from the method of forming the second interconnection layer 7 illustrated in FIG. 43. The second interconnection layer 70 is formed by sequentially depositing the titanium film 11, the titanium nitride film 9, and the aluminum alloy film 10. Usually, the films are successively deposited in a vacuum. The titanium film 11 provides significant advantages, especially when the through hole 16 is relatively narrow and deep. These advantages can be understood by referring to FIGS. 11(A)-12(B).

Figure 11A:
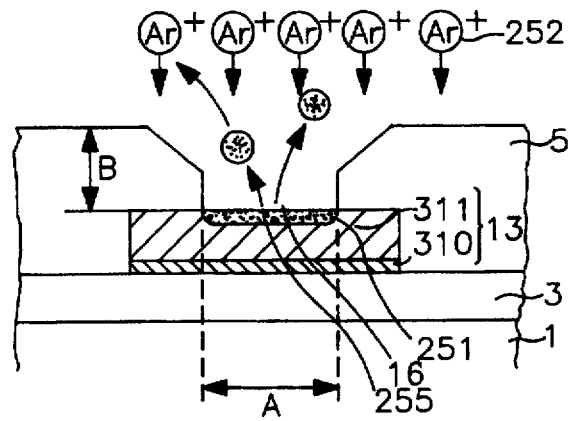
FIGS. 11(A) and 11(B) are cross-sectional views illustrating a sputter etching process employed in a method according to an embodiment of the invention.
Figure 11B:
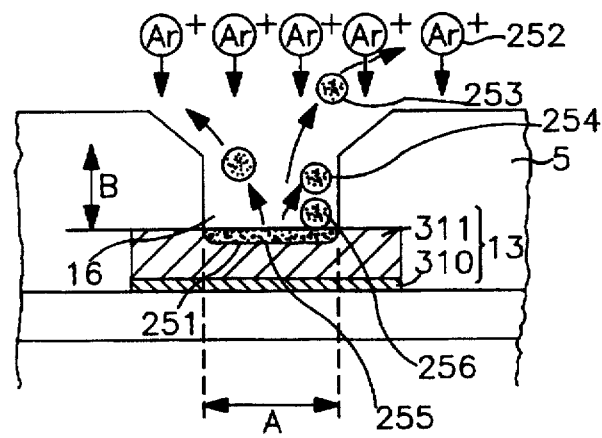
Figure 12A:
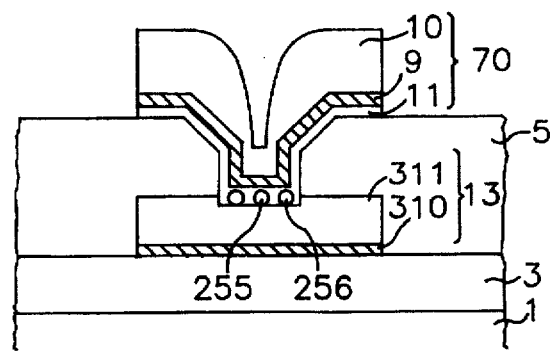
FIGS. 12(A) and 12(B) are cross-sectional views illustrating the interface structure in an interconnection according to an embodiment of the invention.
Figure 12B:
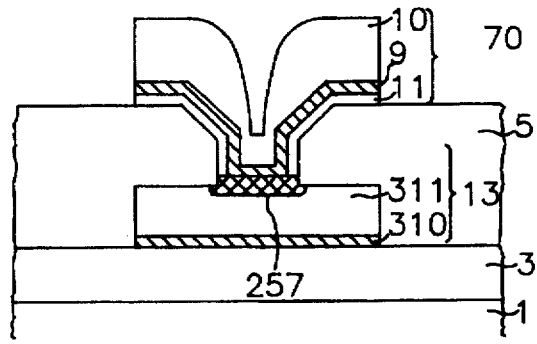

FIGS. 11(A) and 11(B) are cross-sectional views of two examples of through hole 16. In FIG. 11(A), the ratio of the depth of the hole, B, to the width of the hole, A, i.e., the aspect ratio, is less than one. In this instance, the through hole 16 is relatively wide compared to its depth. As a result, during the argon ion sputtering step illustrated in FIG. 8, the particles 253 ejected from the aluminum alloy film 311 relatively easily exit from the through hole. Therefore, the argon ion sputtering step is effective in cleaning the exposed surface of the aluminum alloy layer 311 by removing contamination caused by the reactions with oxygen and fluorine that occur when the through hole 16 is formed by dry etching. Thus, in this situation, the sputtered surface 255 is relatively clean because the sputtered particles do not return and re-adhere to that surface. However, in the situation shown in FIG. 11(B), where the aspect ratio of the through hole 16 is relatively large, it is difficult for the sputtered particles 253 to exit from the through hole 16. Instead, some of those sputtered particles return to the surface 255 and are deposited elsewhere on the second dielectric layer 5 adjacent the through hole 16. The titanium film 11 is deposited to a thickness of about 15 nanometers to react with the sputter etching products that remain on the surface 255 and adjacent that surface in the through hole 16. The titanium film 11 reacts with the fluorine and oxygen in the sputtered material when heated to a temperature of 300° C. to 450° C. to form titanium fluoride and titanium oxide. Therefore, as illustrated in FIG. 12(A), even if particles 256 from the sputtering step remain on the surface 255, the fluorine or oxygen in them reacts with the titanium during the heat treatment which lasts fifteen to sixty minutes. Preferably, the heat treatment is not carried out until all layers of the second interconnection layer 70 are deposited. During the heat treatment, the aluminum alloy film 311 at the interface 255 reacts with the titanium film 11 to produce an intermetallic region 257, shown in FIG. 12(B). This reaction ensures a good electrical contact between the first and second interconnection layers 13 and 70. The titanium nitride film 9 prevents the titanium film 11 from reacting with the aluminum alloy film 10. The multiple film second interconnection layer 70 also has a high resistance to stress migration that can cause the second interconnection layer 7 of the conventional structure to become electrically open.

After depositing the second interconnection layer 70, that layer is patterned using conventional photolithographic techniques, as illustrated in FIG. 9. Finally, the third dielectric layer 8 is deposited to provide protection against the intrusion of moisture as in the conventional structure.

Figure 13A:
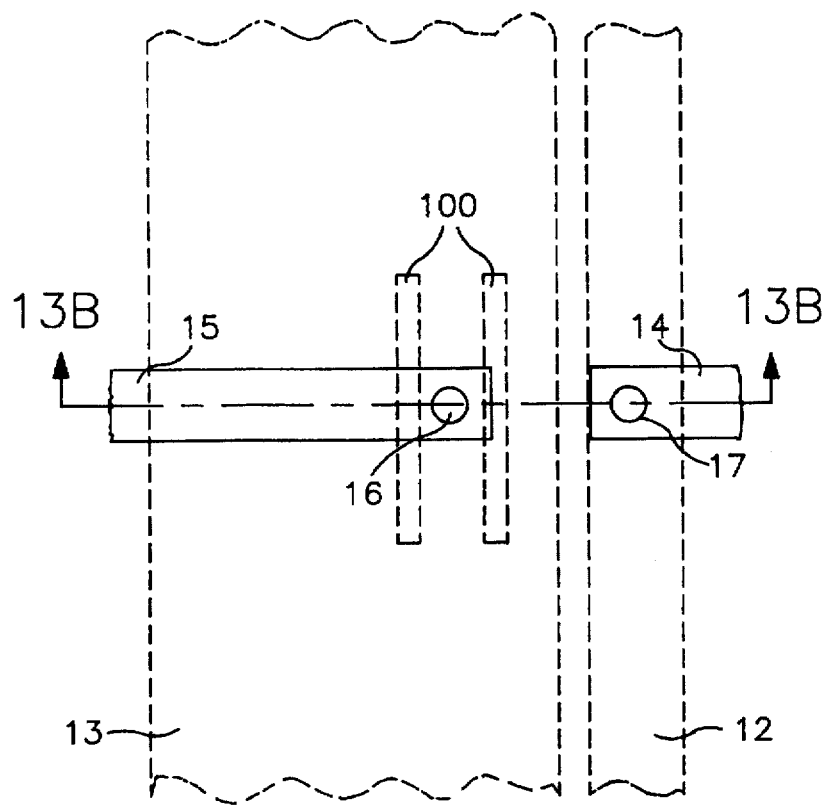
Figure 14A:
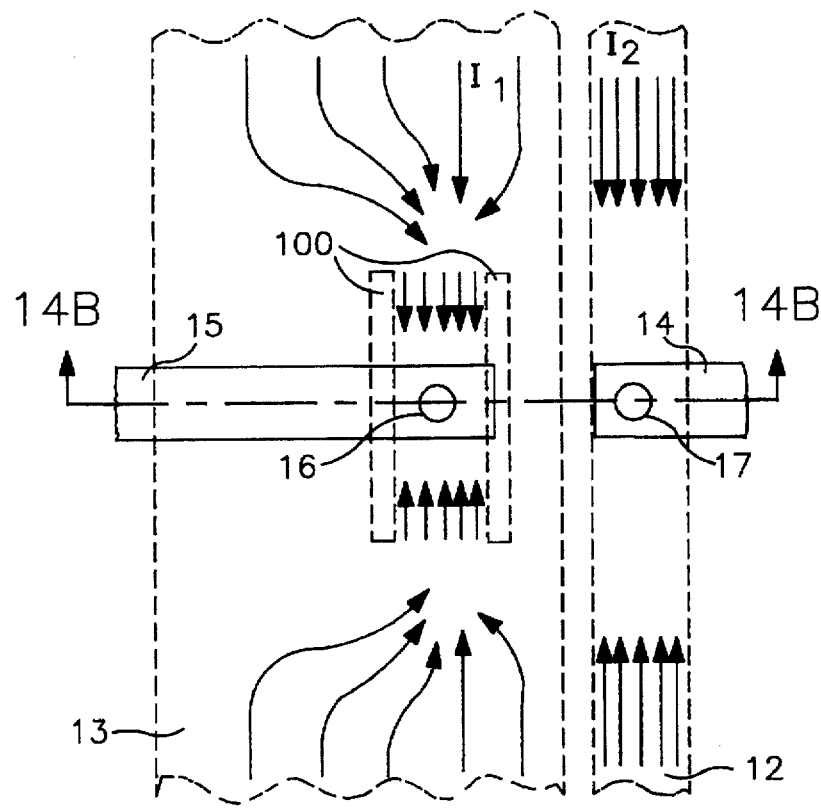
Figure 14B:
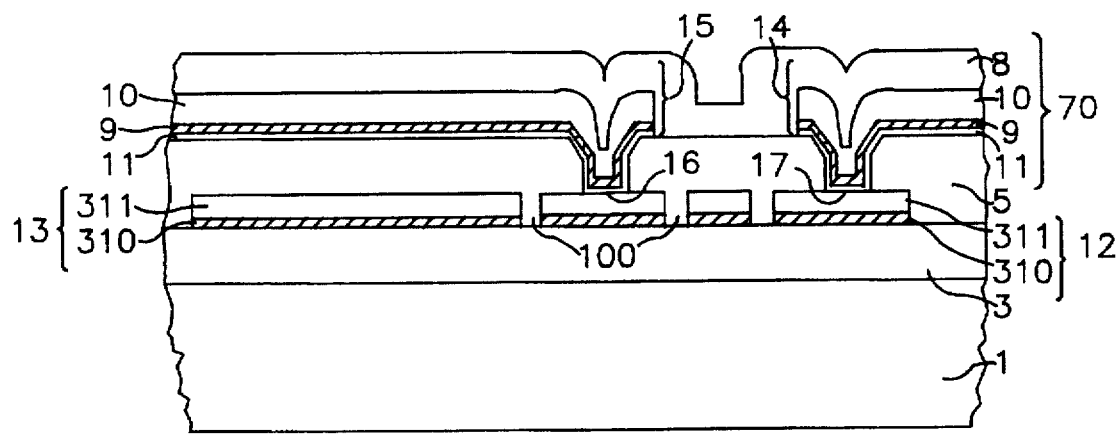
Figure 15A:
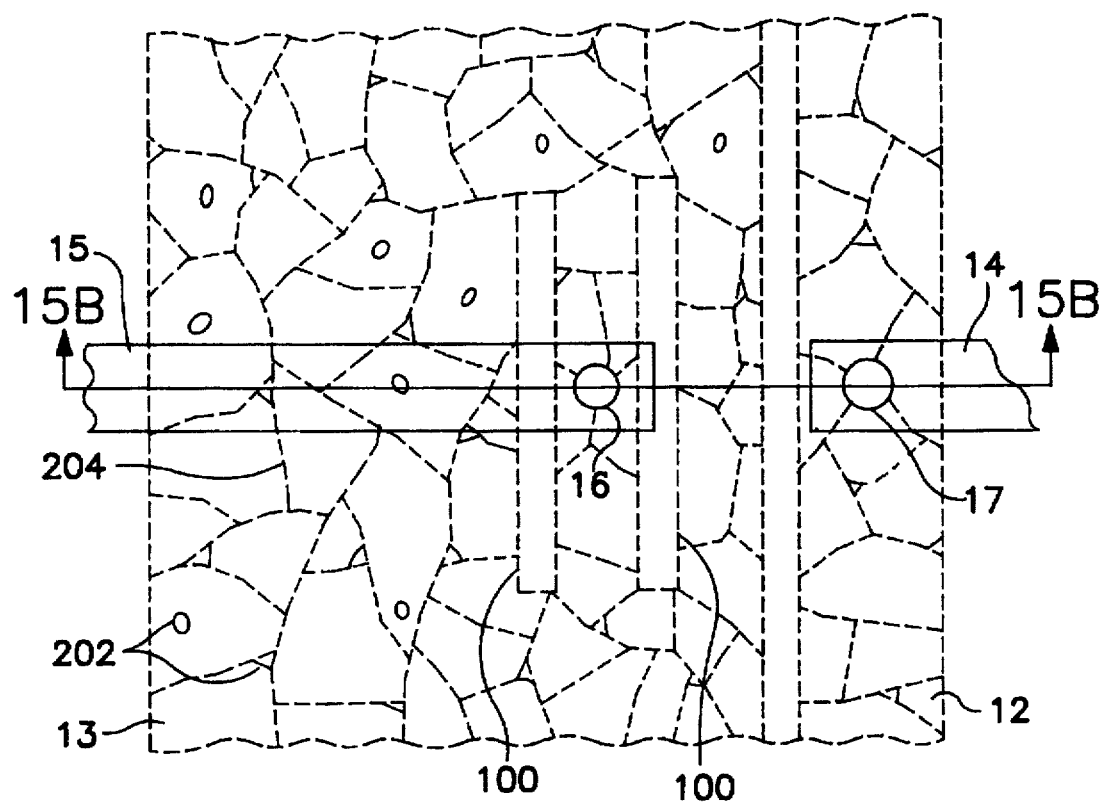
Figure 15B:
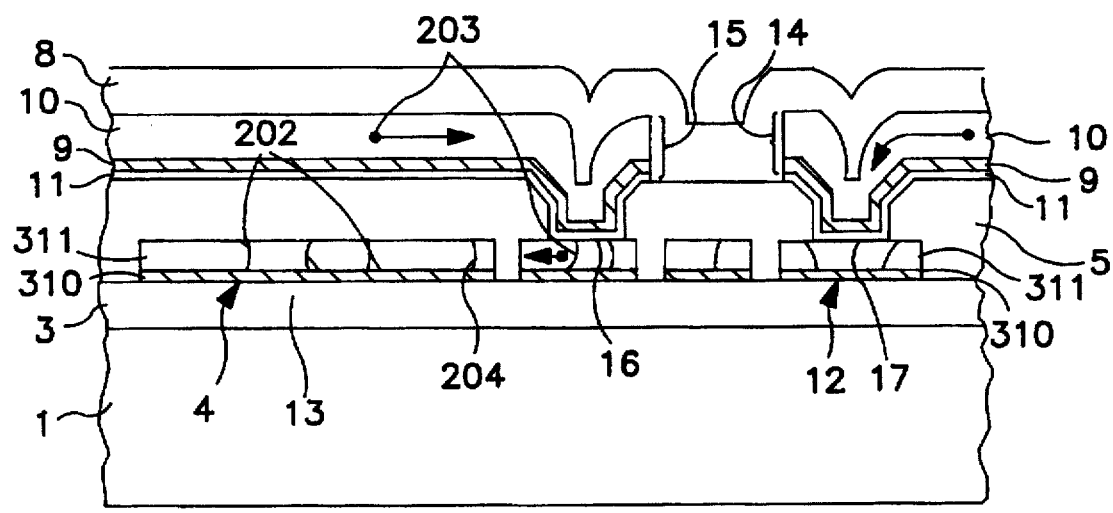
Figure 16A:
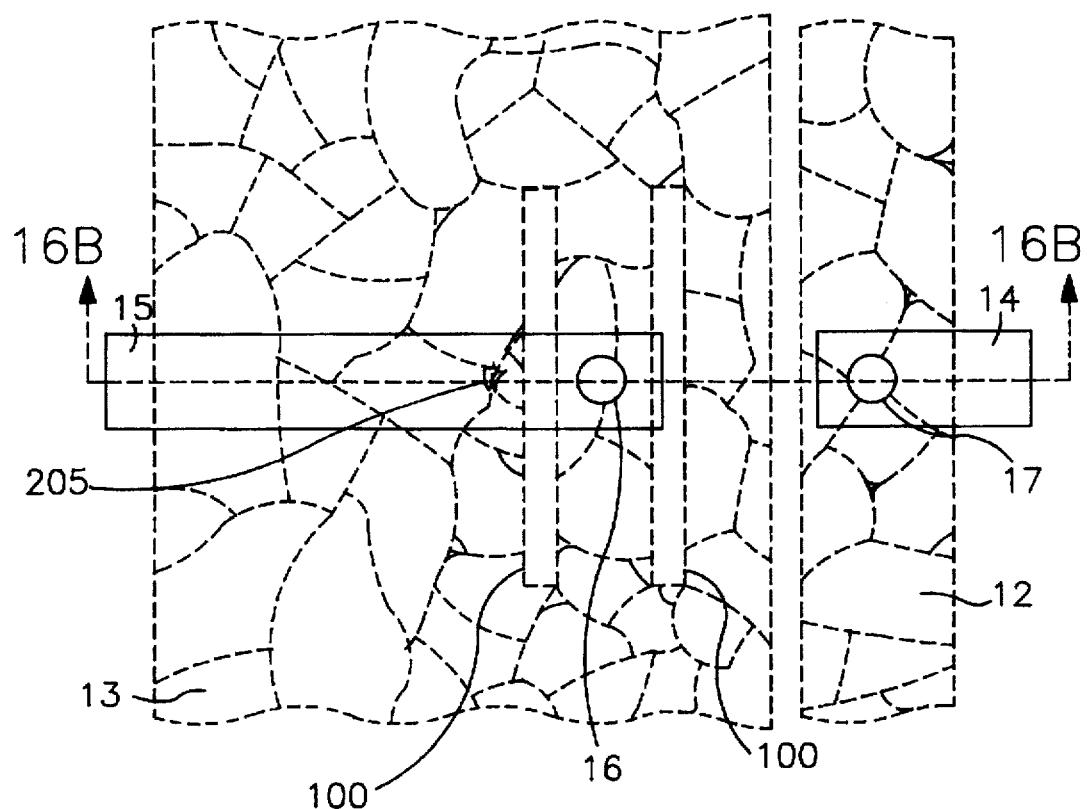
Figure 16B:
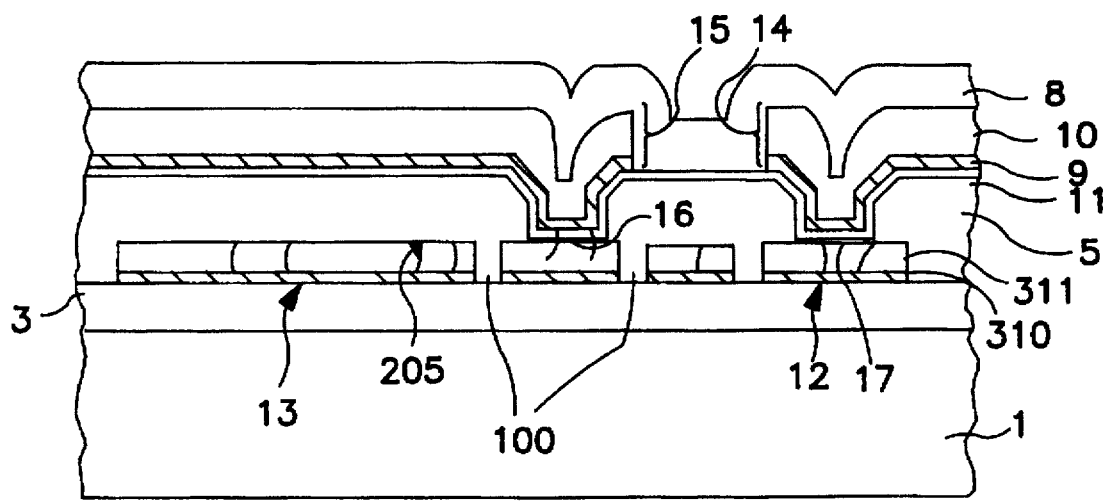
Figure 17A:
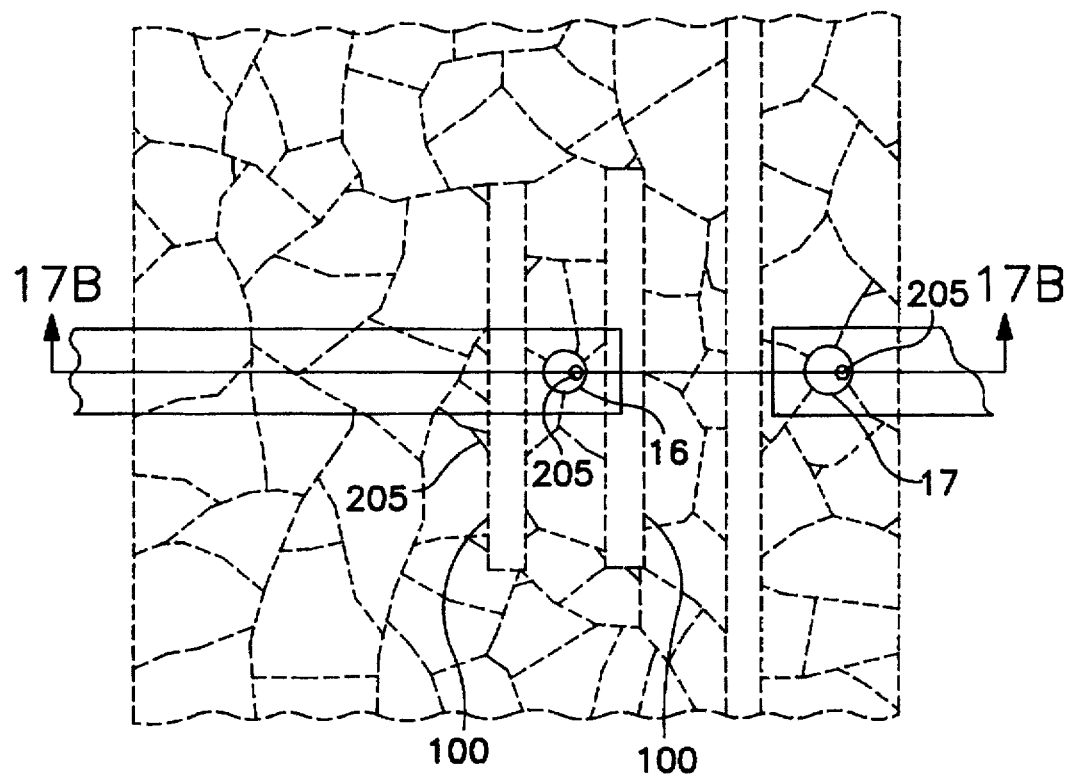
Figure 17B:
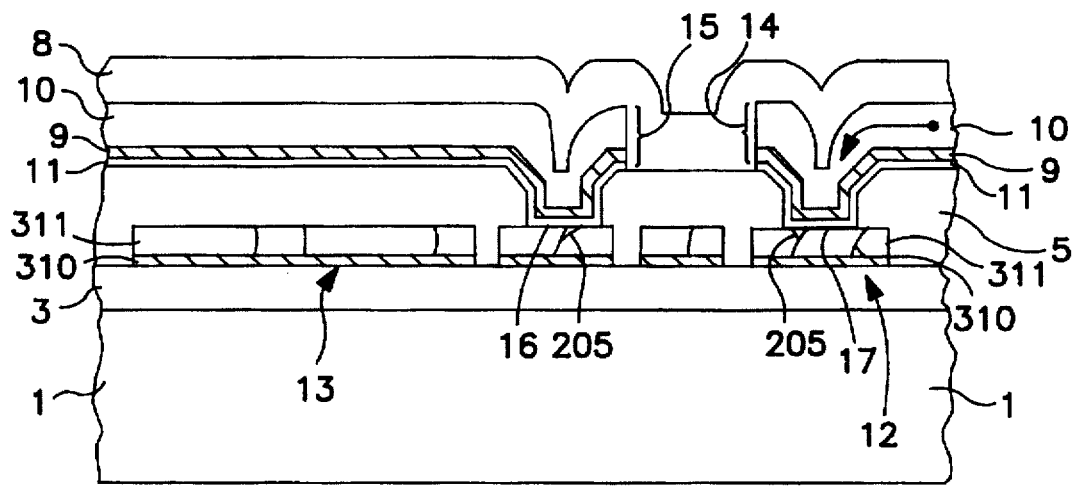
Figure 47A:
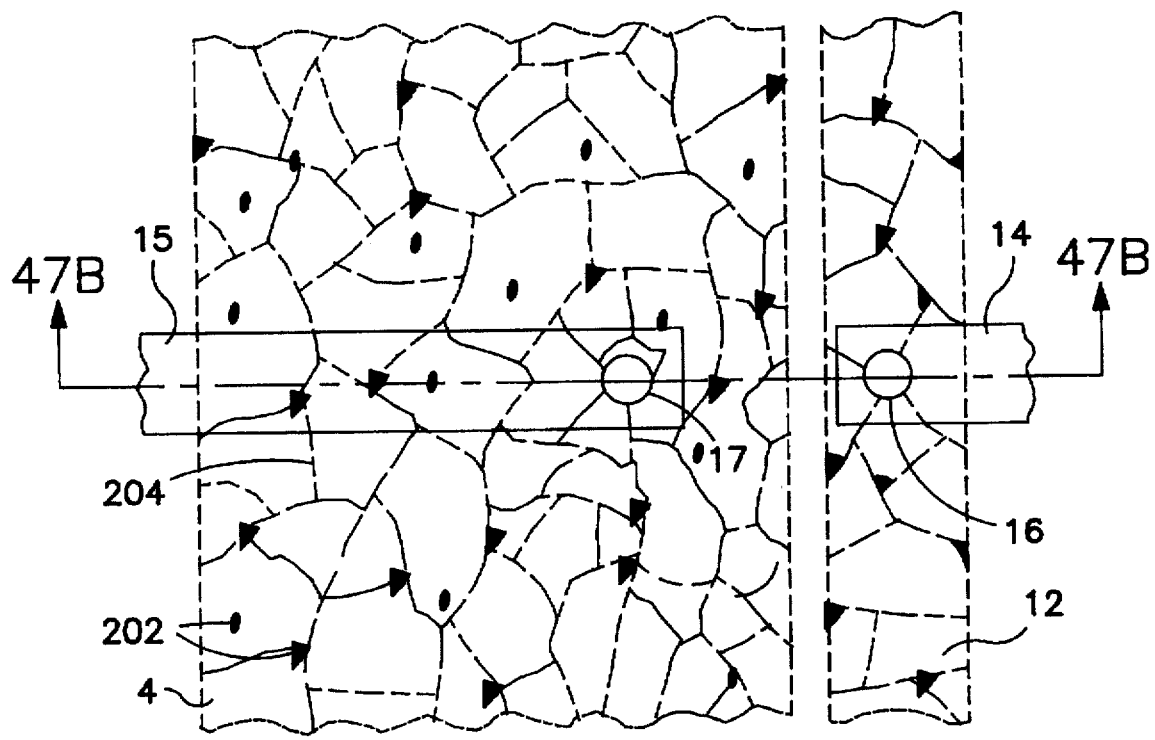
Figure 47B:
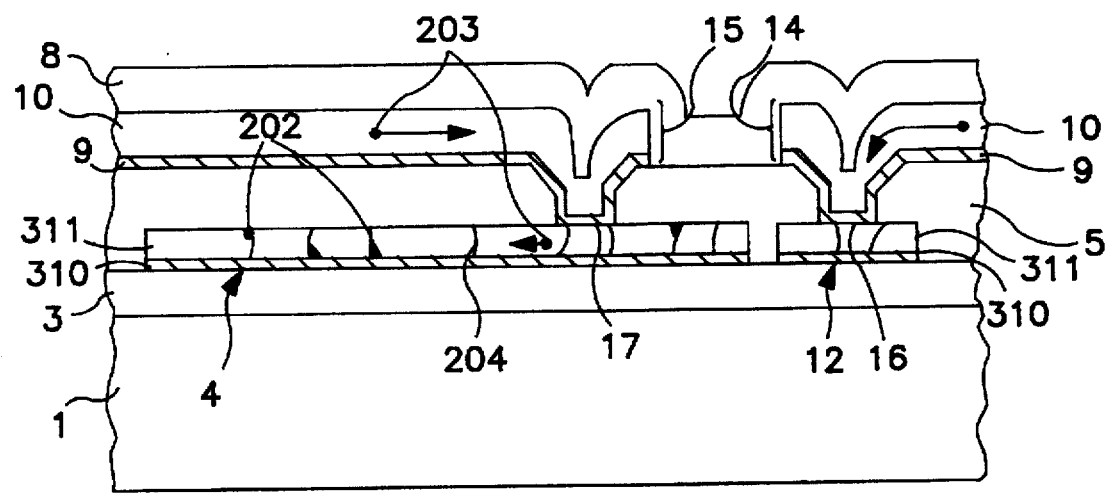
Figure 48A:
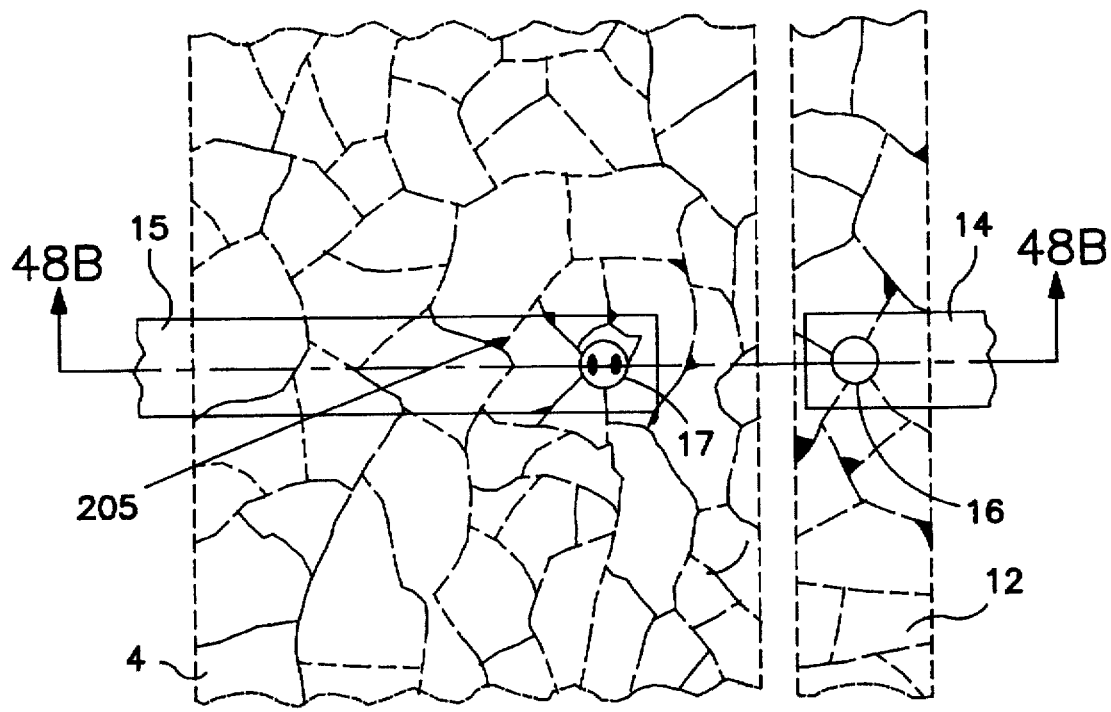
Figure 48B:
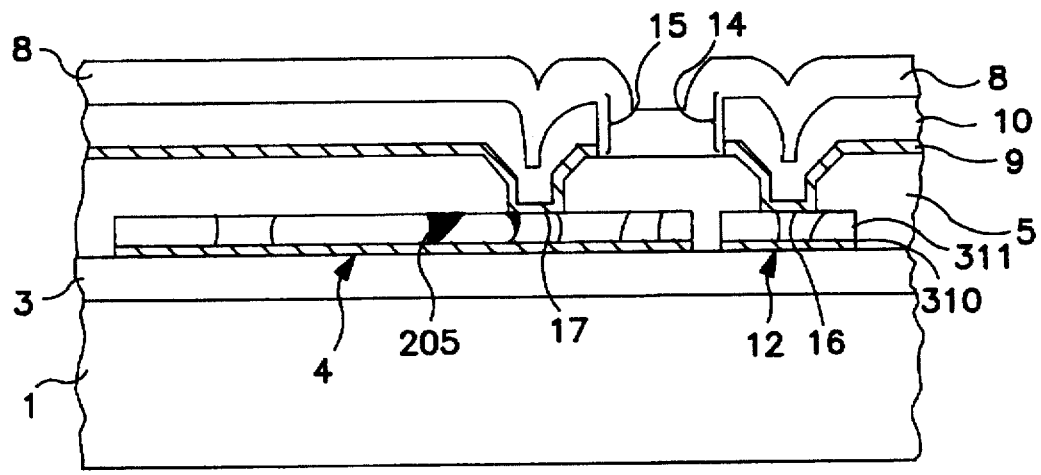
Figure 49A:
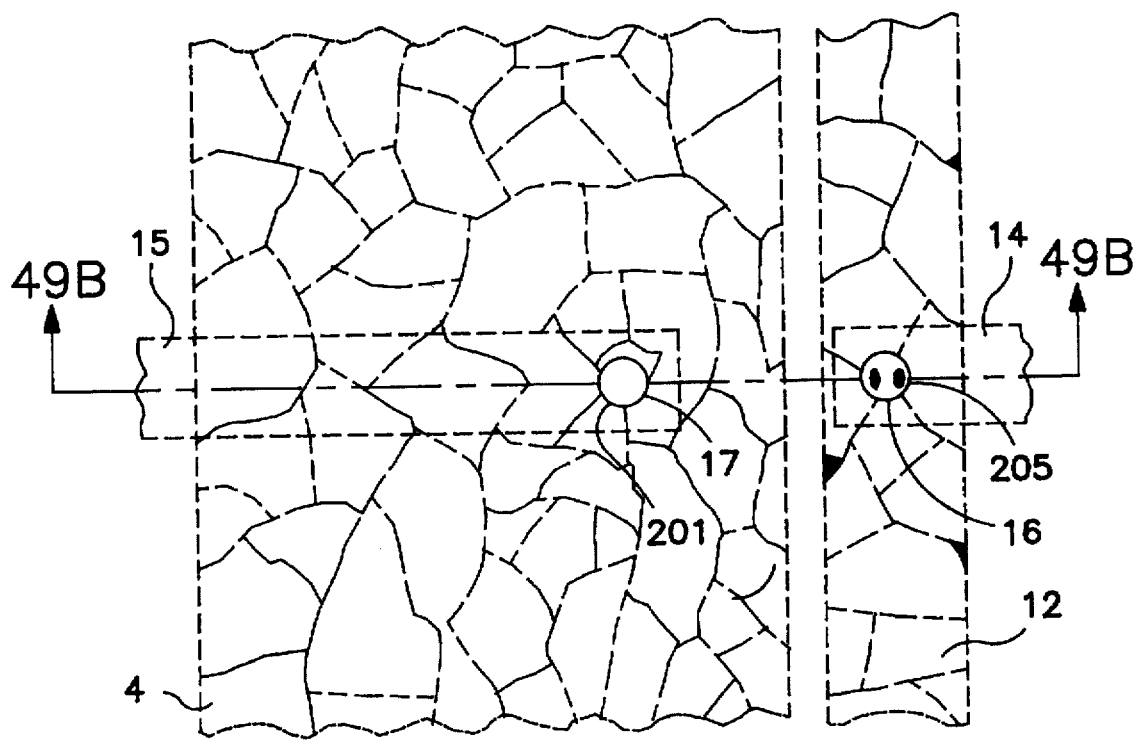
Figure 49B:
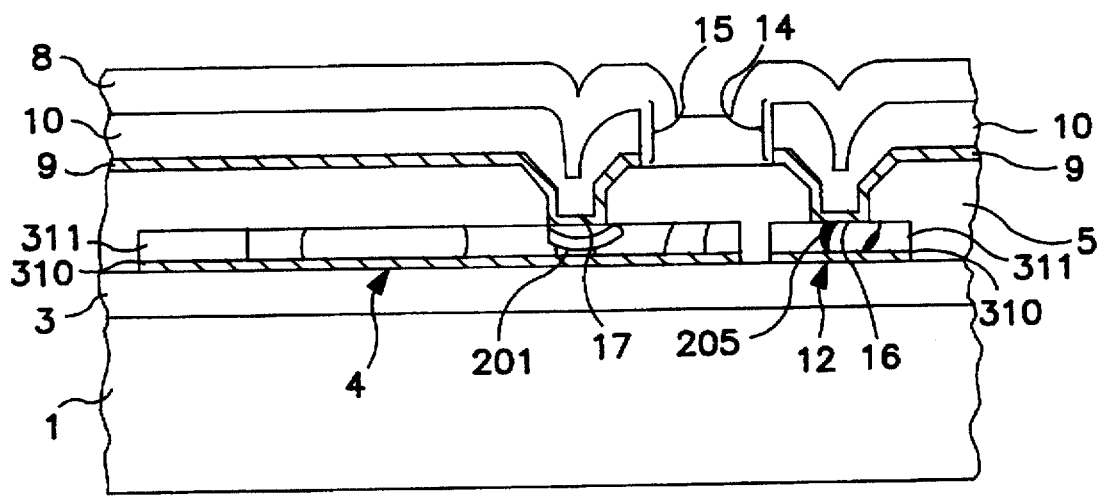
Figure 50A:
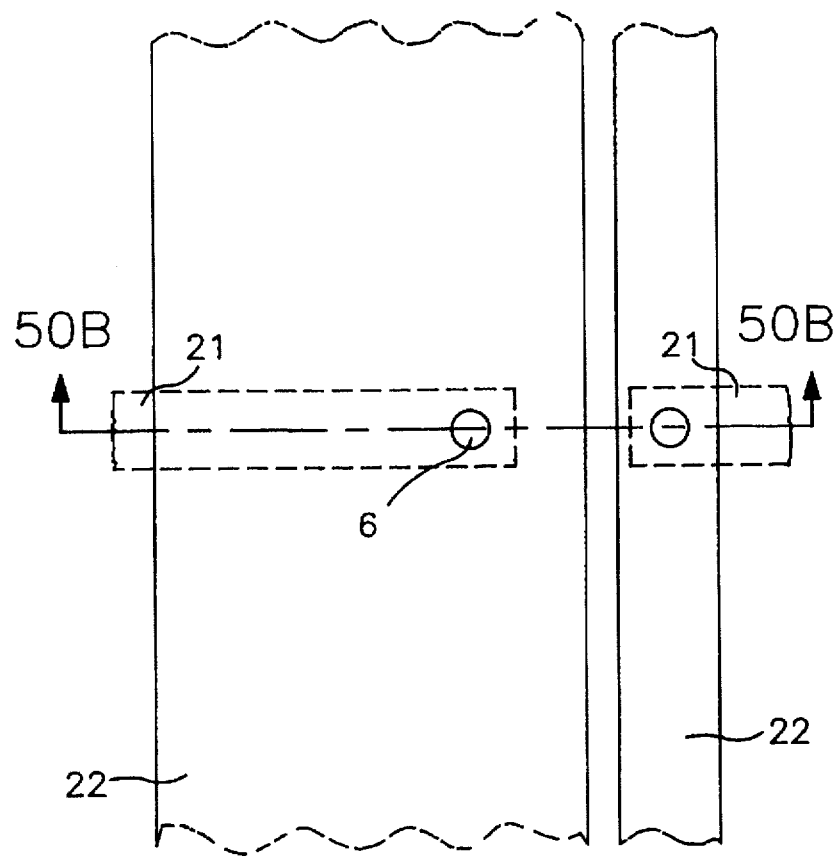
Figure 50B:
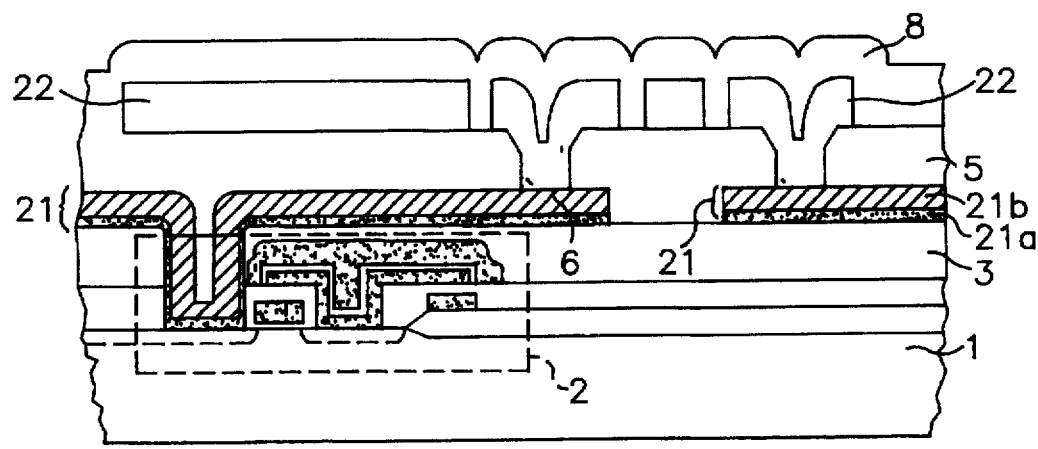
Figure 51A:
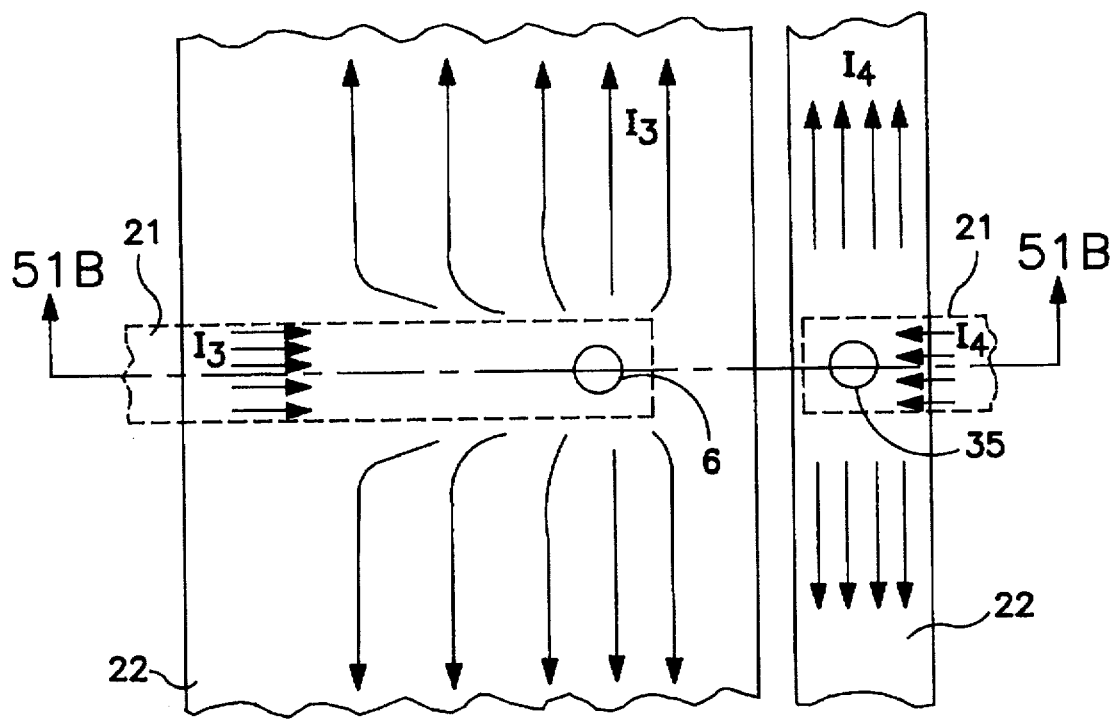
Figure 51B:
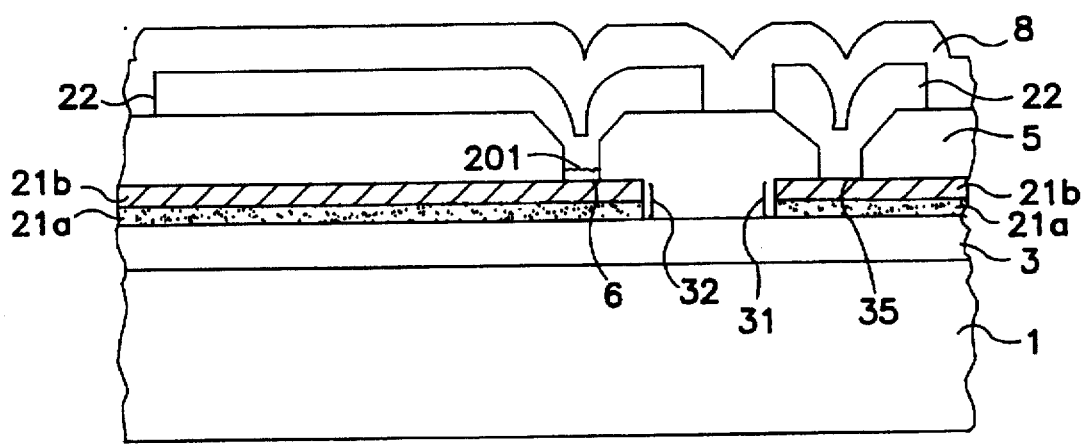

In addition to the advantages achieved by using the second interconnection layer 70 including three films, additional advantages are achieved in the invention by including the barriers 100. The barriers 100 control the direction of the flow of current to and from the through hole 16 and restrain the flow of defects in electromigration as described with respect to FIG. 47. The current flow in the structure shown in FIG. 13(A) is illustrated in FIG. 14(A). The migration of defects in response to the controlled current flows is illustrated in FIGS. 15(A)-17(A). As shown in FIG. 14(A), because of the presence of the insulating barriers 100, current flow I1 is restrained to flow between those barriers in order to reach the through hole 16. The defects in the aluminum alloy film 311 become larger during current flow because of the movement of aluminum atoms. However, the barriers 100 prevent the defects 202 shown in FIG. 15(A) from reaching the through hole 16. Because the average path length of the defects to the through hole 16 is increased by the presence of the insulating barriers 100, most of the defects become trapped around an insulating barrier 100 and do not reach the through hole 16. As a result, no large void that gradually causes an increase in electrical resistance and finally an electrically open circuit is formed near the through hole 16.

Figure 18A:
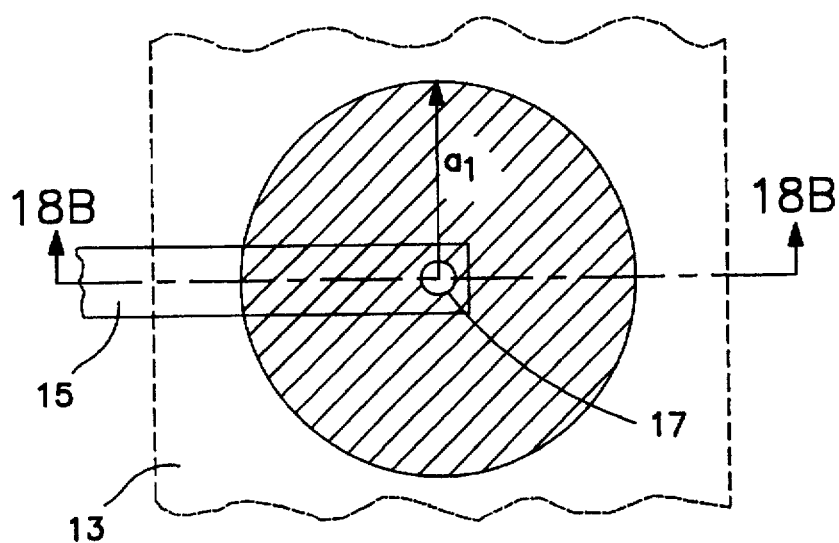
FIG. 18(A) is a plan view for describing a model of the migration of defects in the vicinity of a through hole in a multi-level interconnection.
Figure 18B:
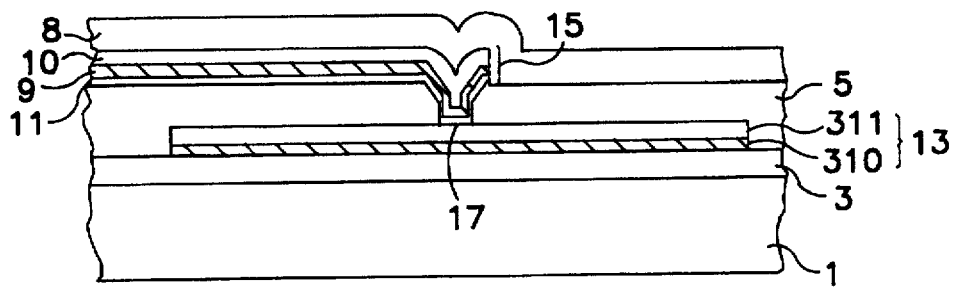
FIG. 18(B) is a cross-sectional view taken along line 18(B)—18(B) of FIG. 18(A).
Figure 18C:
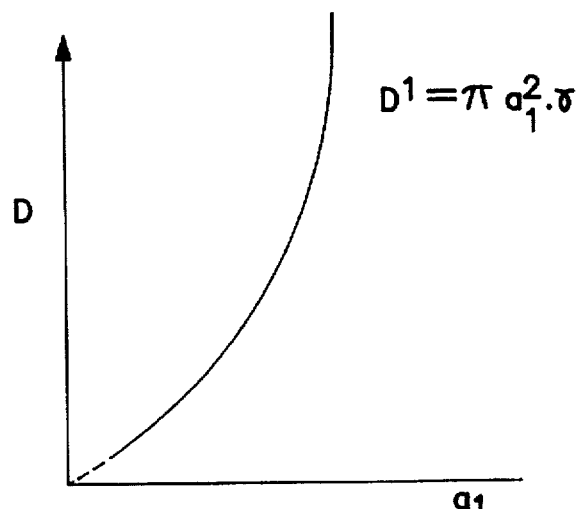
FIG. 18(C) is a graph showing the relationship between the quantity of defects that collect around a through hole in an interconnection as a function of the distance of the defects from the through hole in the model according to FIG. 18(A).
Figure 19A:
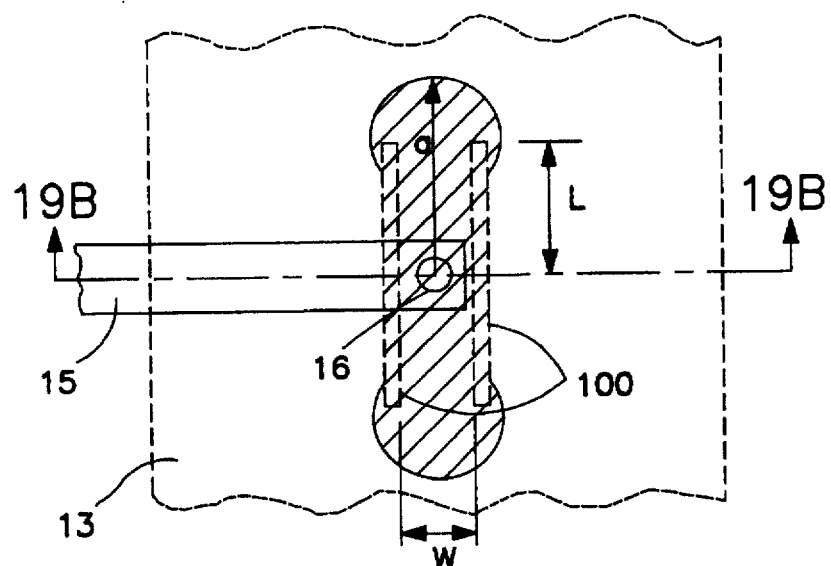
FIG. 19(A) is a plan view for describing a model of the migration of defects in the vicinity of a through hole in a multi-level interconnection according to an embodiment of the invention.
Figure 19B:
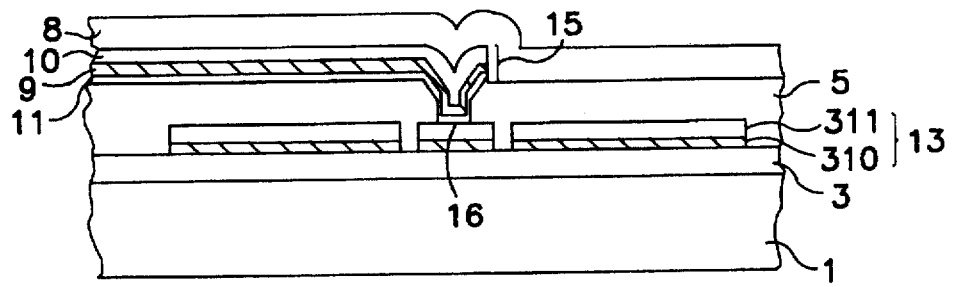
FIG. 19(B) is a cross-sectional view taken along line 19(B)—19(B) of FIG. 19(A).
Figure 19C:
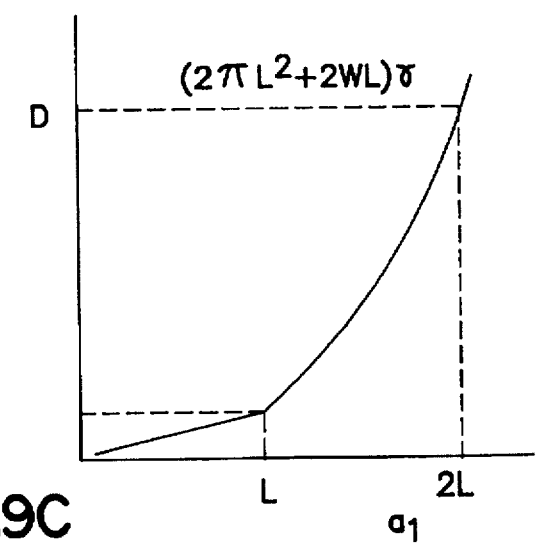
FIG. 19(C) is a graph showing the relationship between the quantity of defects that collect around a through hole in an interconnection as a function of the distance of the defects from the through hole in the model according to FIG. 19(A).

The operation of the insulating barrier in preventing defect migration can be understood using a simple model, referring to FIGS. 18(A)-18(C). In the model, the defect density in the aluminum alloy layer is r, $a_1$ is the distance that a defect can move, and D is the quantity of defects that can collect at the through hole. In effect, D is a measure of area. When the insulating barrier does not exist in the interconnection, the quantity of defects that can accumulate at the through hole 17 is $D1=\pi a_1^2 r$. When an insulating barrier is present, as in the example shown in plan view in FIG. 19(A), the quantity of defects D2 that can collect at the through hole 16 is $2wa_1 r$ where, as shown in FIG. 19(A), the spacing of the two barriers is w, the barriers each have a length of 2L, and $0 \leq a_i \leq L$. If $L \leq a_i \leq 2L$, then the quantity of defects D2 that accumulate is equal to $D2=2r[wL+\pi(a_i-L)^2]$. When $a_1=L$, a measurement of the effectiveness of a barrier structure is specified as the ratio of D2 to D1 denoted by $$\delta = D2/D1 = 2wL/\pi L^2 = 2\alpha/\pi$$

where $\alpha=w/L$. If $\delta$ is equal to 0.5, meaning that the barriers reduce the quantity of accumulated defects by a factor of two, then $\alpha$ equals 0.785 so that L equals about 1.27 w. If L is 1.5 or more times w, the reliability of the interconnection around the through hole is improved by a factor of at least two. The lower limit on the width w, i.e., the spacing between the two insulating barriers 100, is determined by the maximum acceptable current density in the first interconnection layer. The spacing w should be much smaller than the length $a_1$ along which the defects can move. The maximum value of $a_1$, i.e., that defect moving length, is several hundred microns, although the length depends upon many conditions. Preferably, the value of w is 1/5 to 1/10 of that maximum length, namely, less than about 30 microns, in order to make the barriers effective.

Figure 13B:
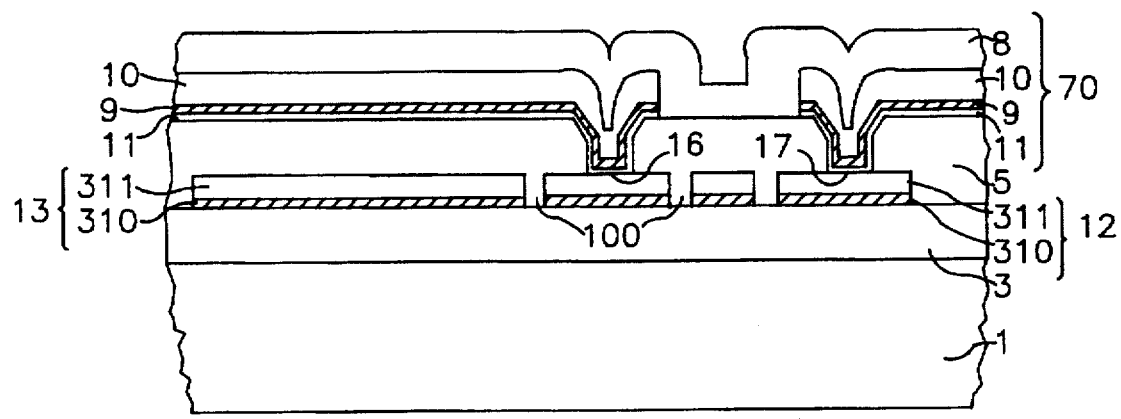
Figure 20A:
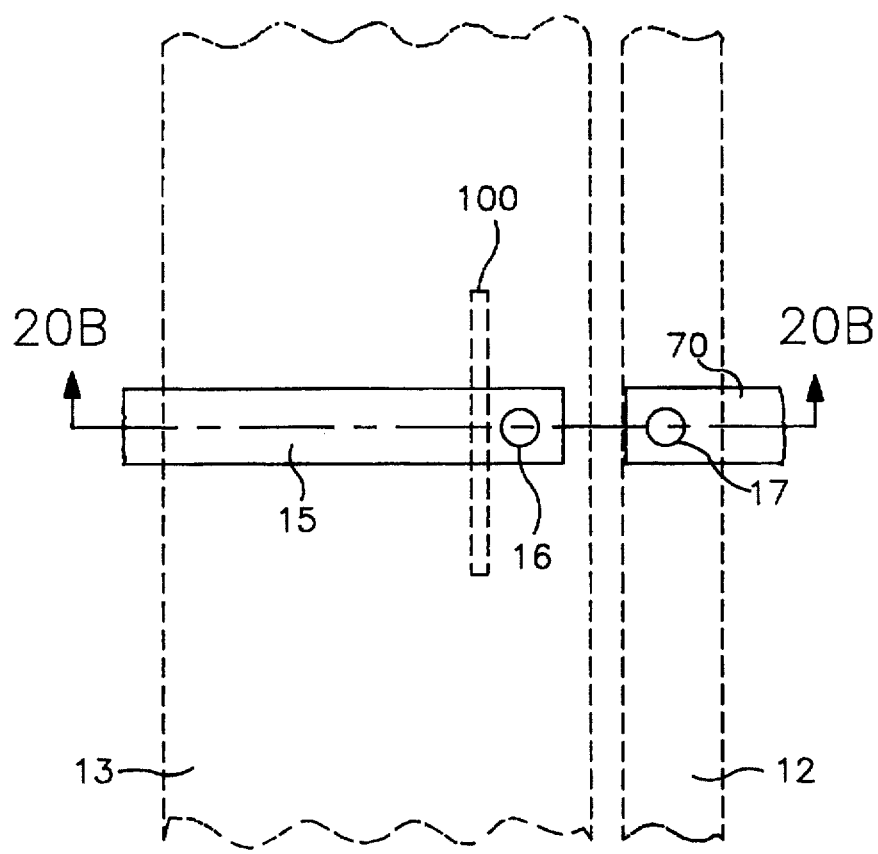
Figure 20B:
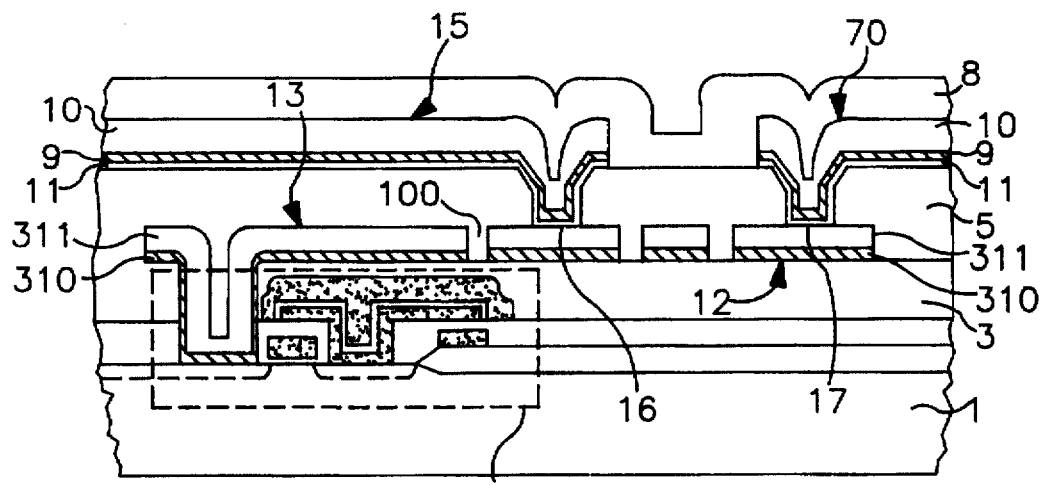
Figure 21A:
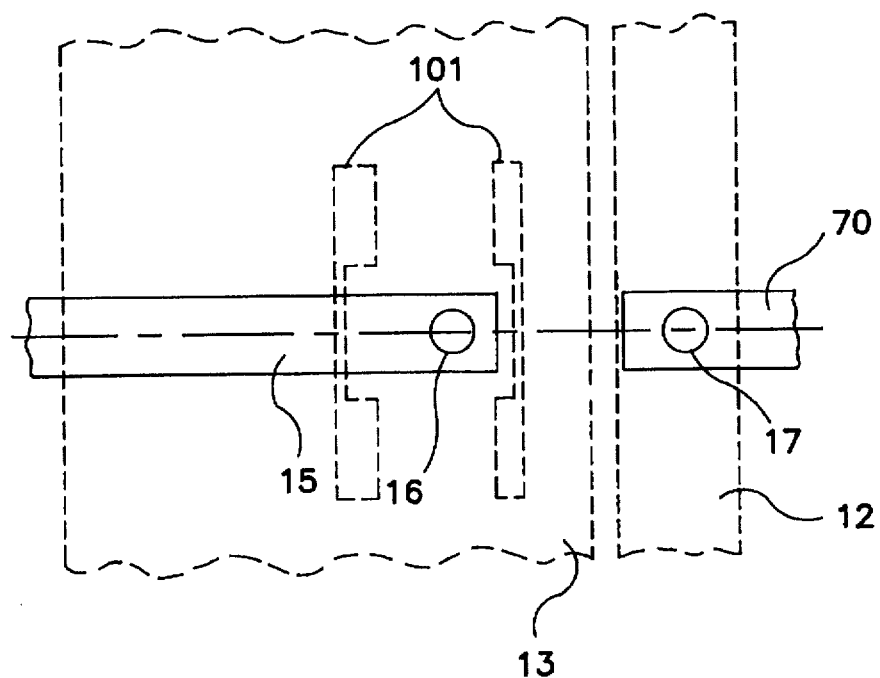
Figure 21B:
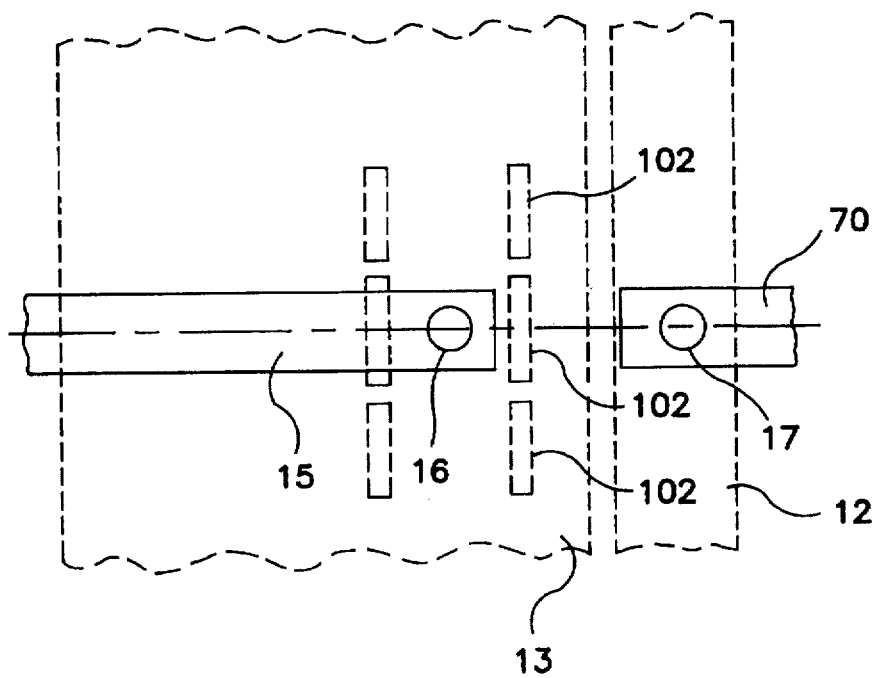
Figure 22A:
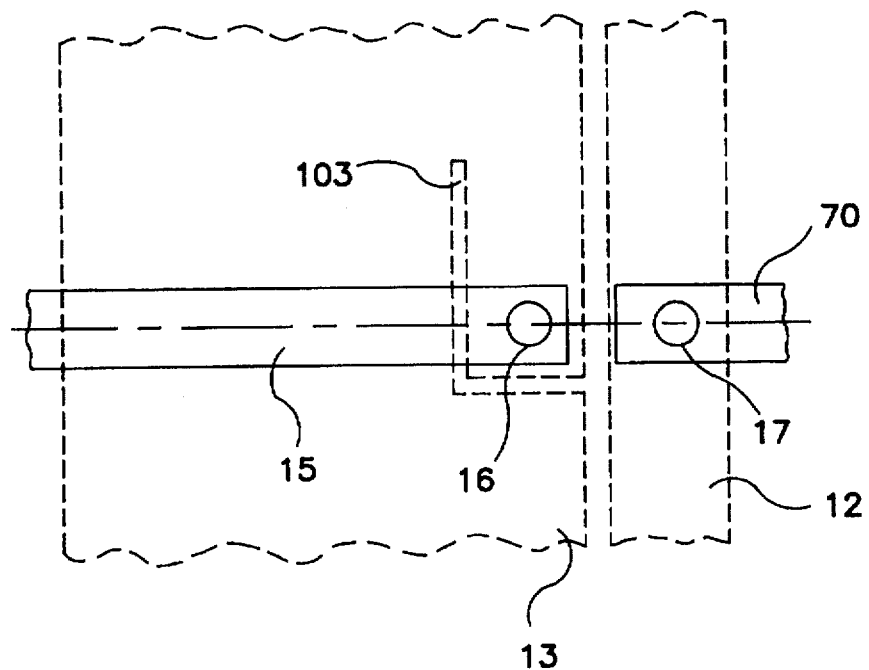
Figure 22B:
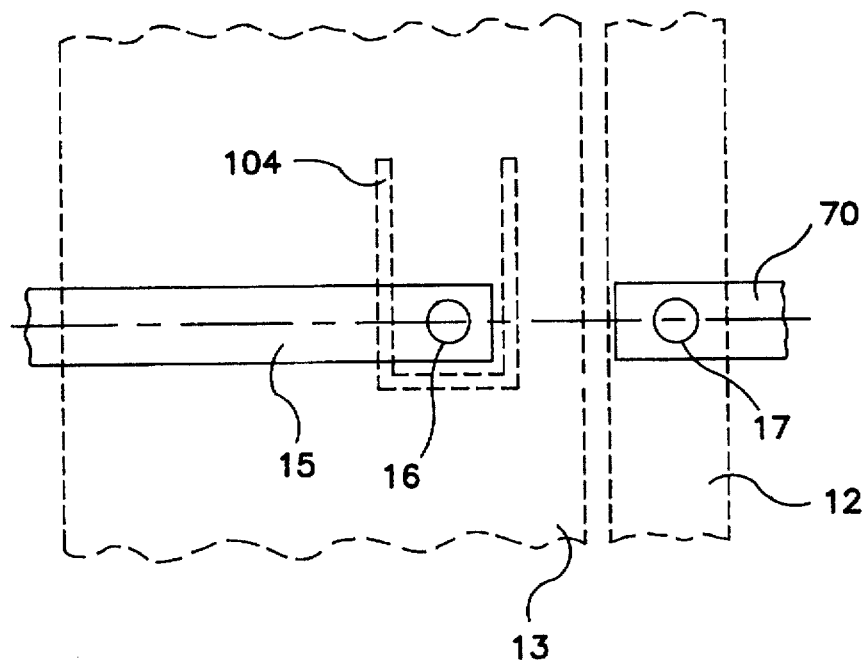

In the embodiment of the invention shown in FIGS. 13(A) and 13(B), the two insulating barriers 100 are formed in grooves in the wide interconnection 13 in order to control the direction of the current flow in the vicinity of the through hole 16. However, as shown in FIGS. 20(A) and 20(B), if the through hole 16 is disposed near the gap between the wide electrode 13 and the narrow electrode 12, that gap will function as one barrier and only a single barrier 100 is needed. In the embodiments of the invention shown in FIGS. 13(A) and 20(A), the barriers 100 are generally rectangular in plan view. However, other barrier shapes may be used. FIG. 21(A) illustrated barriers 101 having widths that vary, in plan view, along the length of the barriers. In FIG. 21(B), a plurality of co-linear rectangular barriers 102 are employed. Still other embodiments of the invention employing different shaped barriers in plan view are illustrated in FIGS. 22(A) and 22(B). An L-shaped barrier 103 is employed in the embodiment of FIG. 22(A) and a U-shaped barrier 104 is employed in the embodiment of FIG. 22(B). Moreover, it is not necessary that the barriers lie along straight lines in plan view. The barriers may be curved.

Figure 23A:
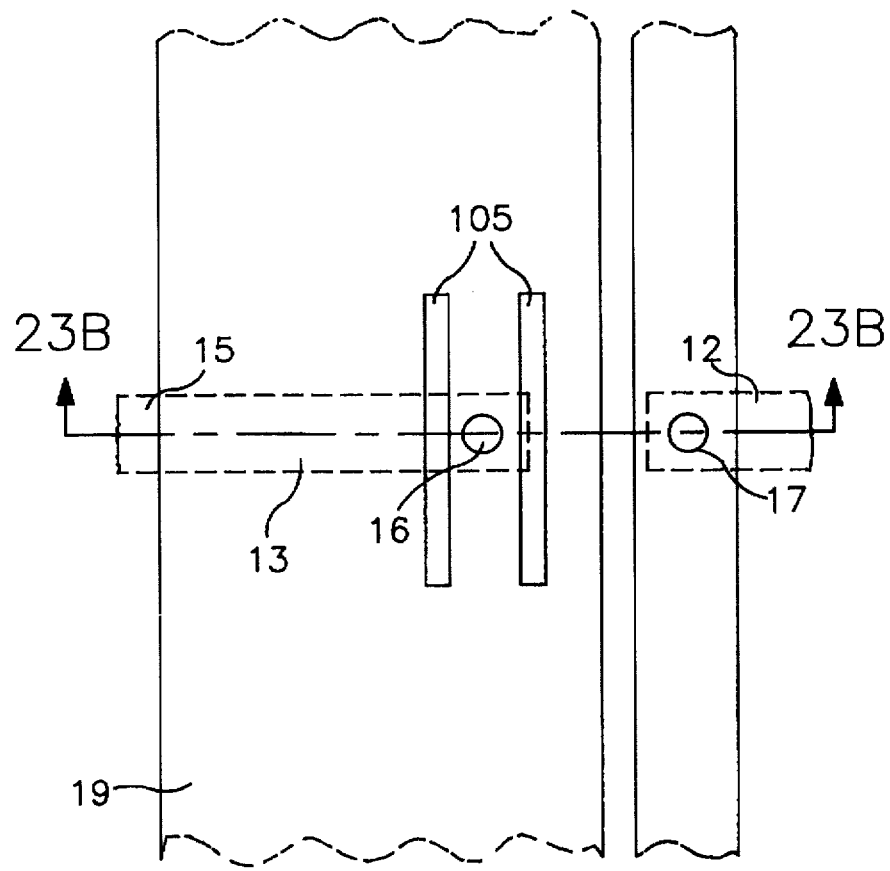
Figure 23B:
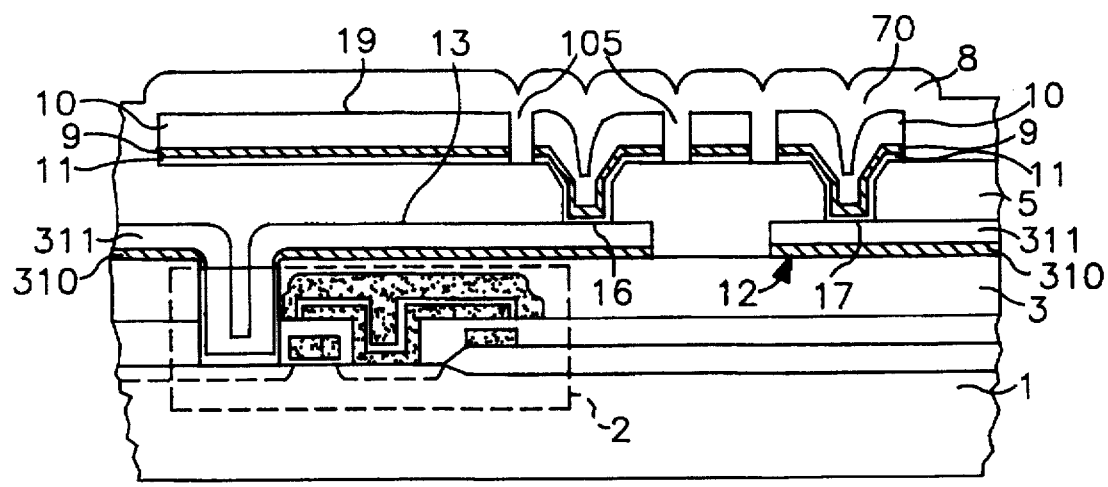
Figure 24A:
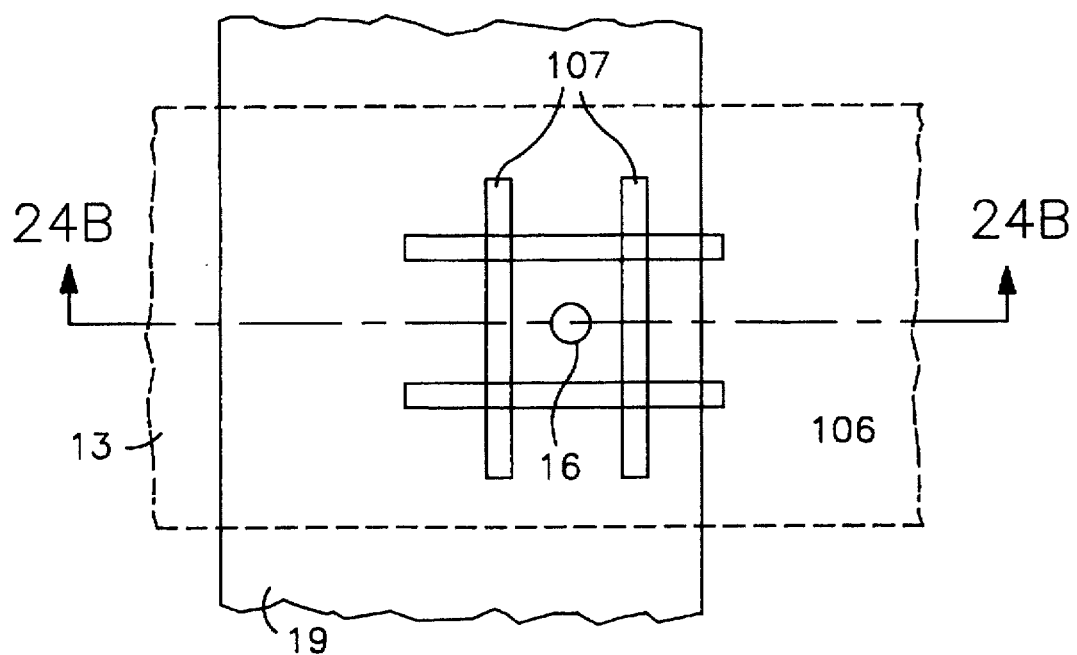
Figure 24B:
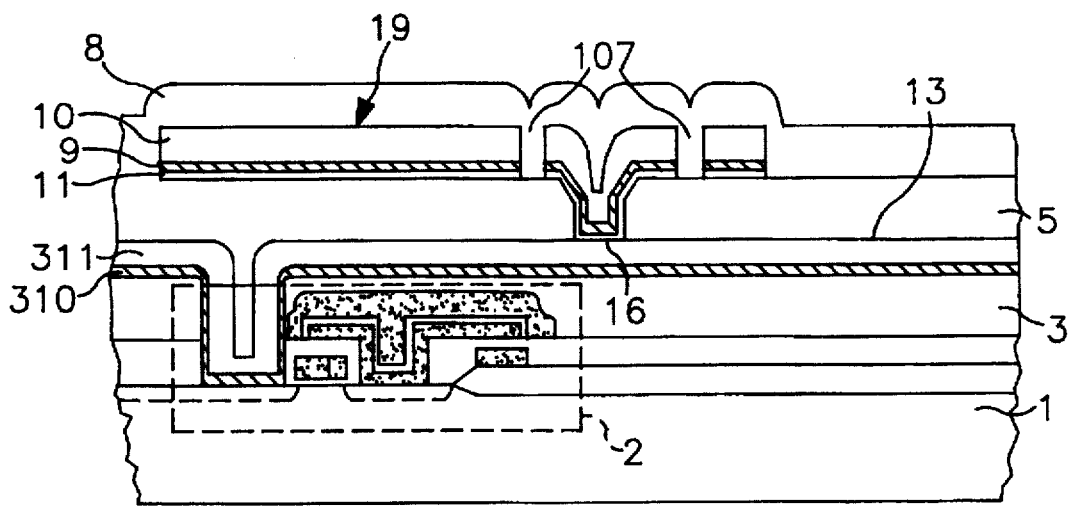
Figure 25A:
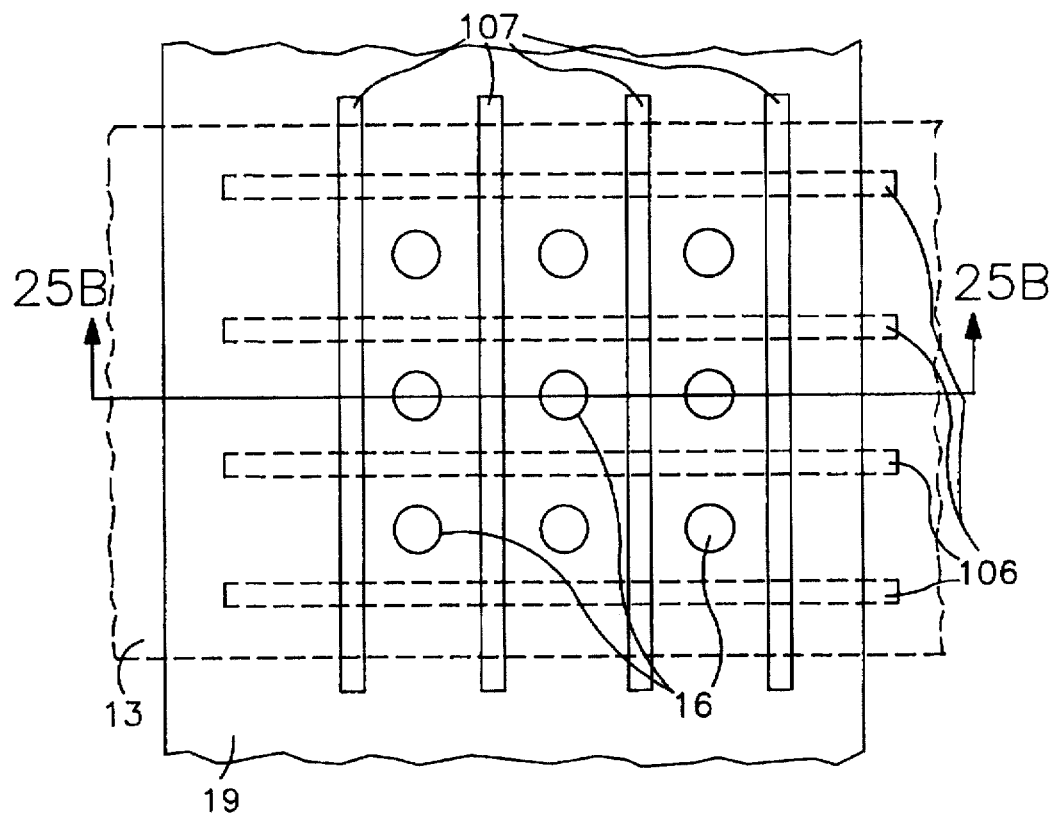
Figure 25B:
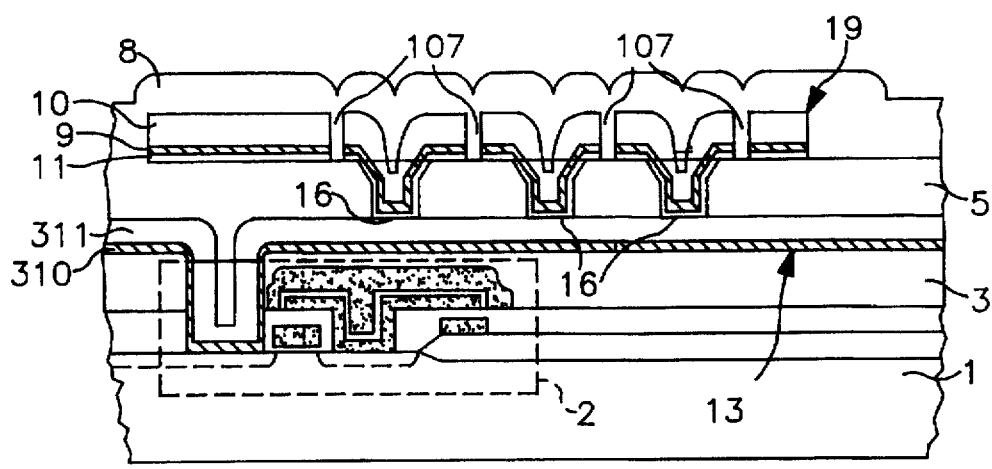

In each of the embodiments of the invention already described, the insulating barriers are formed in the wide interconnection layer 13. The insulating barriers, therefore, restrain defects that move within that layer toward the through hole 16. However, when the current flow is in the opposite direction, the same defect movement phenomenon can occur in the second interconnection layer 70. That defect movement can result in increased resistance or an electrical disconnection in the second interconnection layer 70. In order to avoid those problems, as shown in FIGS. 23(A) and 23(B), barriers 105 may be provided on opposite sides of the through hole 16 in the second interconnection layer 70. If one of those interconnection layers is wider than the other, it is preferred that the insulating barrier or barriers be disposed in the wider interconnection layer. In addition, as shown in FIGS. 24(A) and 24(B), where each interconnection layer is relatively wide, each interconnection layer includes a pair of insulating barriers. Insulating barriers 106 are disposed in a lower interconnection layer 13 and insulating barriers 107 are disposed in an upper interconnection layer 19. In FIGS. 25(A) and 25(B), an embodiment of the invention is shown that includes multiple through holes 16 and multiple barriers 106 and 107. Each through hole in each wide interconnection layer lies between two of the insulating barriers in that layer.

Figure 26A:
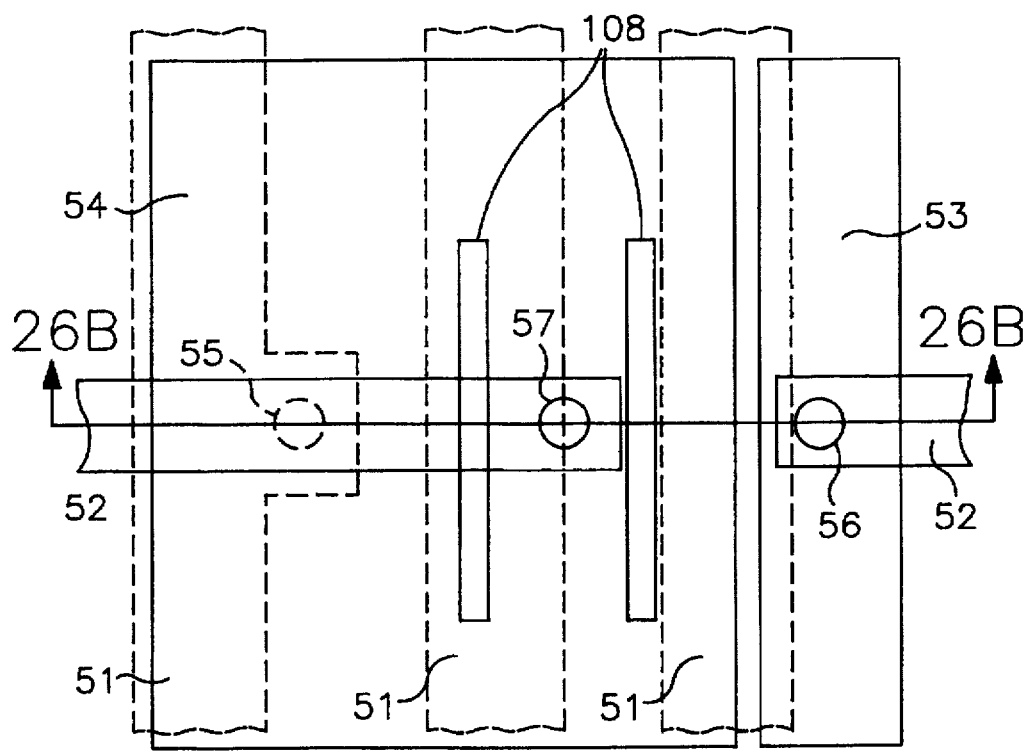
Figure 26B:
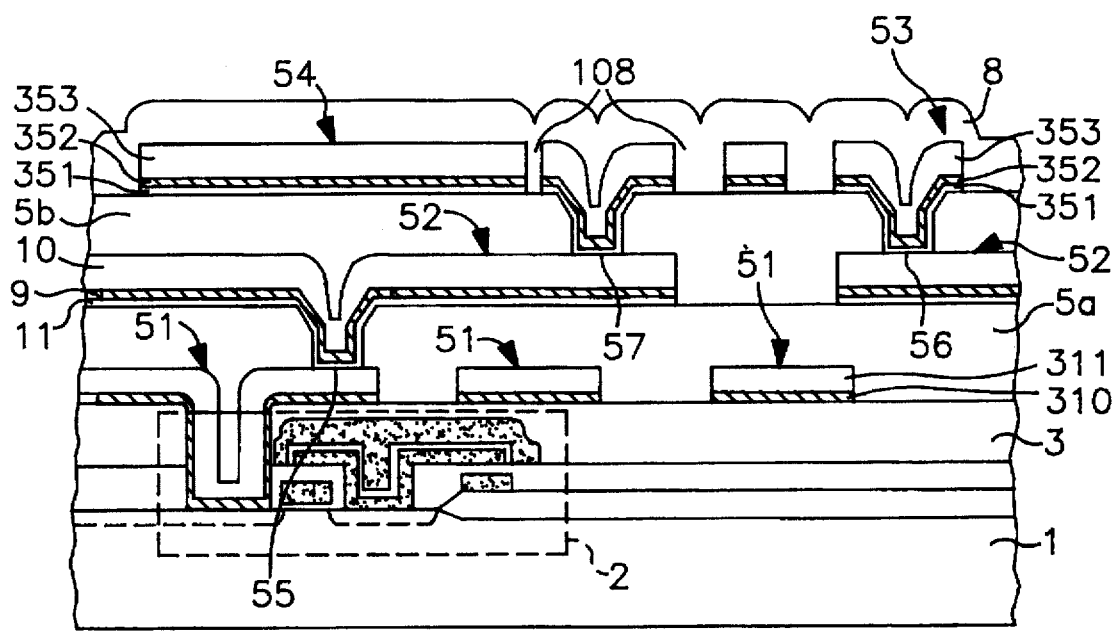

Although the embodiments of the invention described above all relate to structures including two interconnection layers, the invention is also applicable to structures including three or more levels of interconnection. In an example shown in FIGS. 26(A) and 26(B), a second interconnection layer 52 connects with a third interconnection layer 54 through a through hole 57. The third interconnection layer 54 includes three films 351, 352, and 353, substantially the same as films 11, 9, and 10, respectively. An insulating barrier 108 is disposed in the third interconnection layer 54 in order to control the direction of the current that flows to the through hole 57.

Figure 27A:
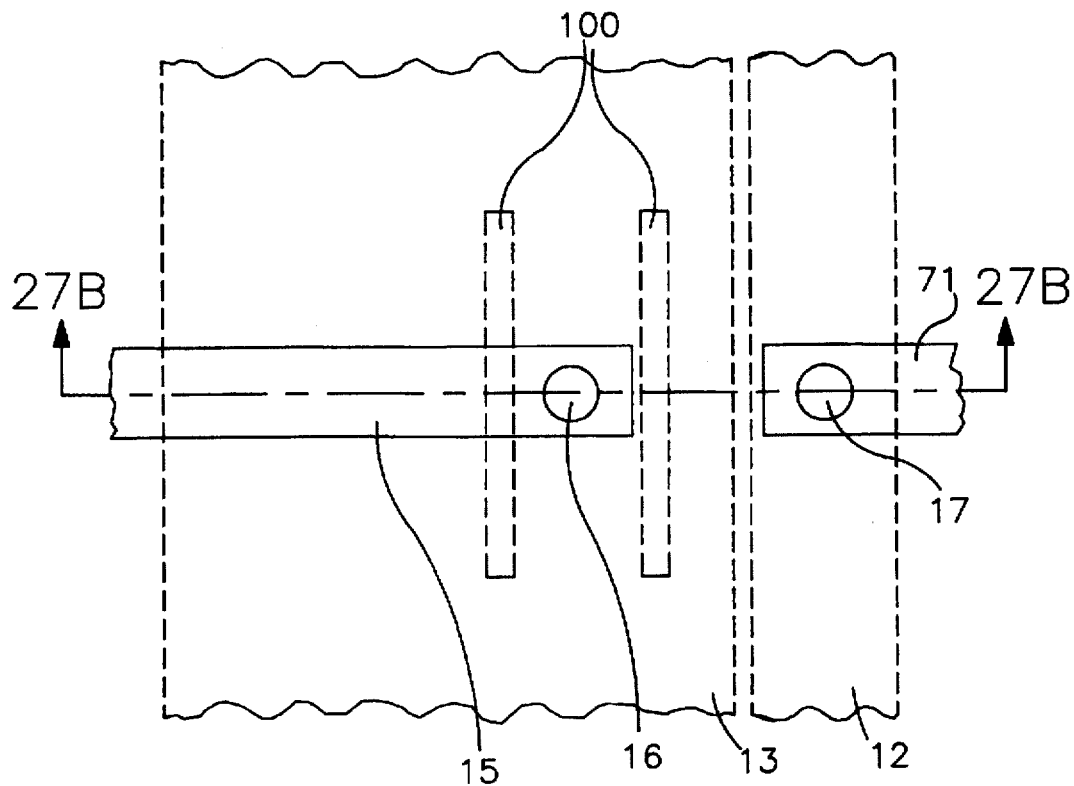
Figure 27B:
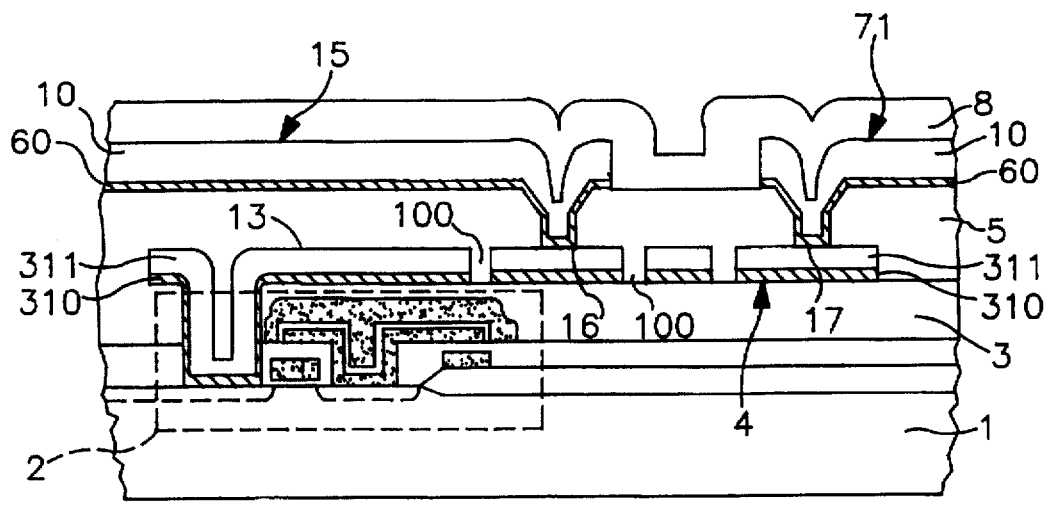
Figure 28A:
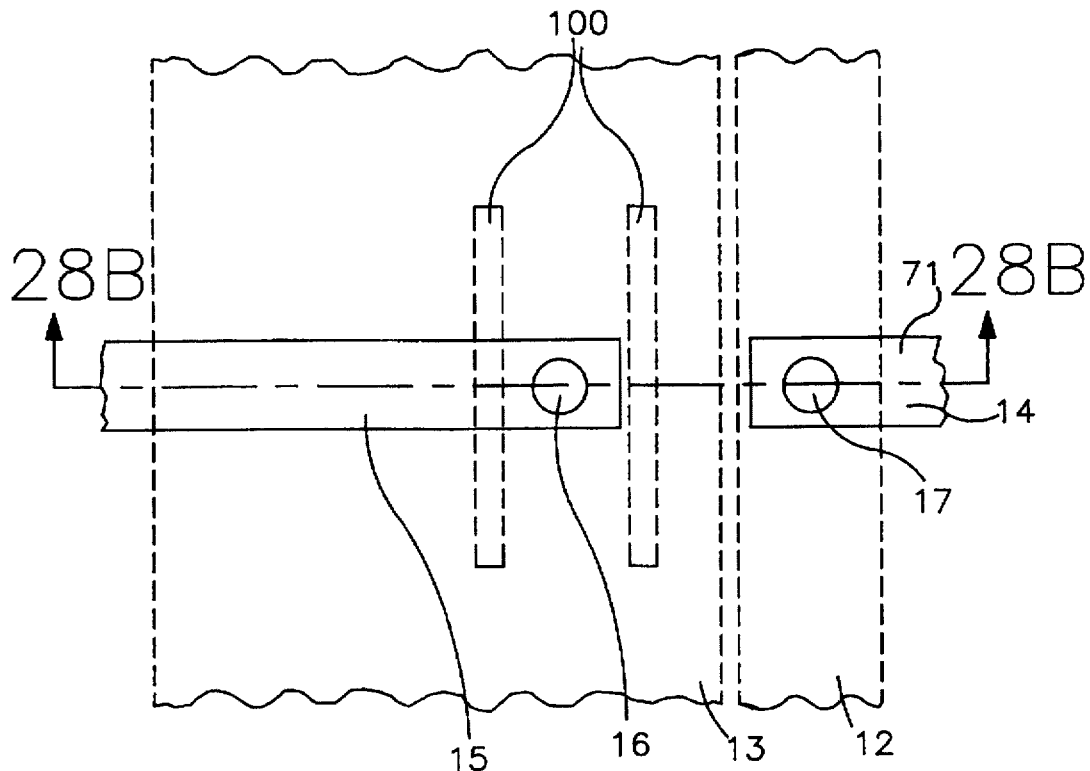
Figure 28B:
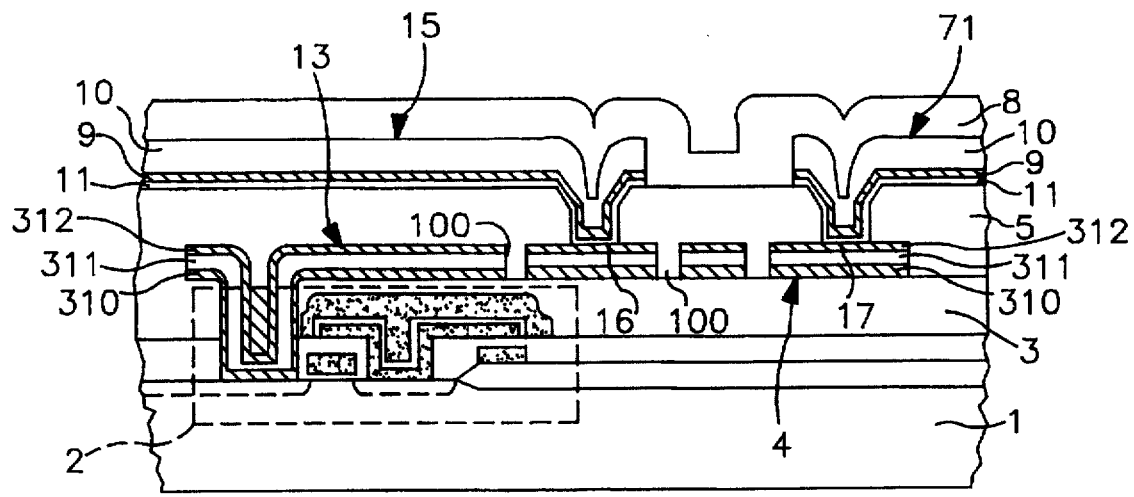
Figure 29A:
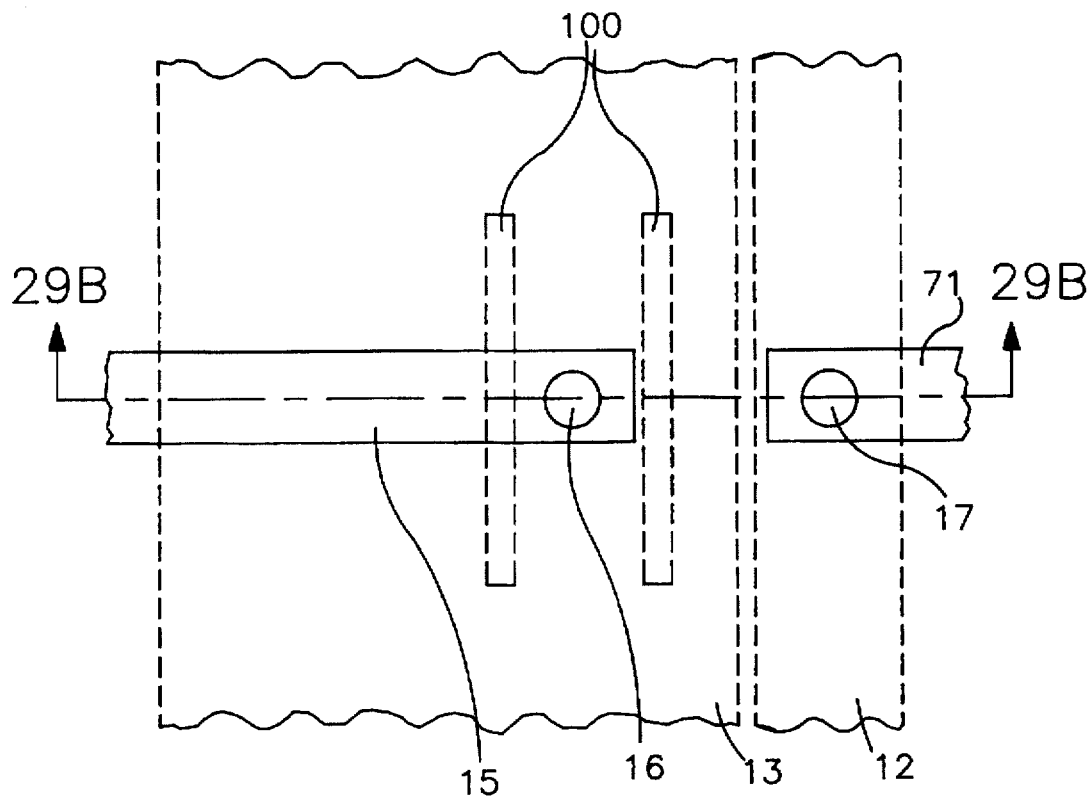
Figure 29B:
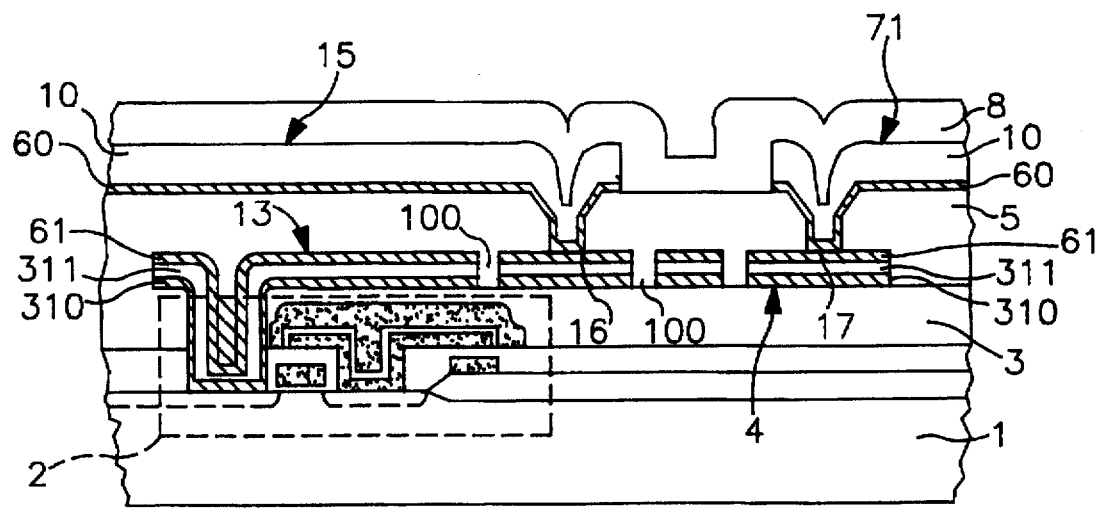

In the embodiments of the invention described above, the second interconnection layer includes a titanium film and a titanium nitride film. However, as shown in FIGS. 27(A) and 27(B), those two films may be replaced by a single film 60. Film 60 may be a refractory metal film, such as titanium, molybdenum, tungsten, or tantalum, a refractory metal silicide film, such as a silicide of any of those four refractory metals, a refractory metal compound film, such as a nitride, oxide, or oxynitride film of any of the four refractory metals, an alloy of two or more of the refractory metals, or an amorphous silicon film. In addition, although the embodiments of the invention described above employ first and second interconnection layers of different compositions, both the first and second interconnection layers may include three films. For example, as shown in FIGS. 28(A) and 28(B), the first interconnection layer includes a titanium nitride film 310, an aluminum alloy film 311, and a titanium nitride film 312. The second interconnection layer 71 includes the titanium, titanium nitride, and aluminum alloy films already described. In this structure, the insulating barrier 100 penetrates the layers 310–312. In FIGS. 29(A) and 29(B), the first interconnection layer includes the titanium nitride film 310, the aluminum alloy film 311, and a surface film 61. The surface film may be selected from the same materials identified above for film 60 in FIGS. 27(A) and 27(B). In all of these structures, defect migration can occur whenever a relatively wide interconnection layer is employed, whether it is the first or the second interconnection layer. Thus, the insulating barriers are disposed in the wide interconnection layer or layers to control the direction of current flow within the wide layer or layers.

Figure 30A:
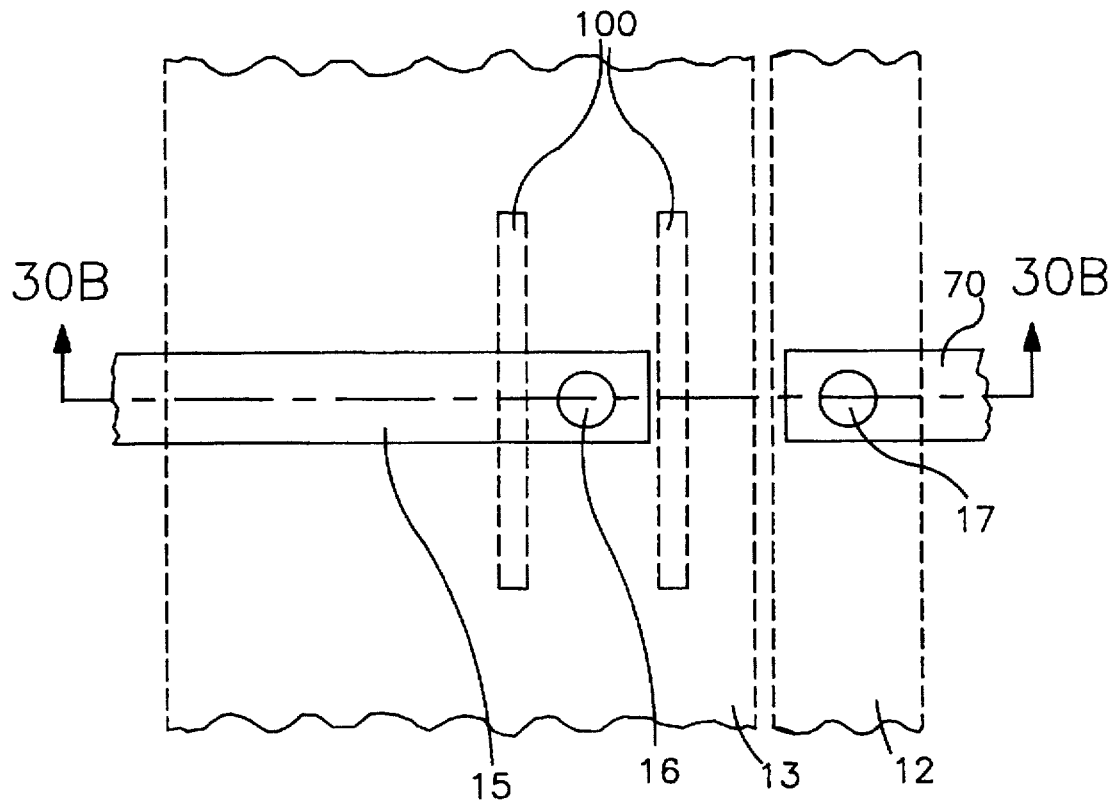
Figure 30B:
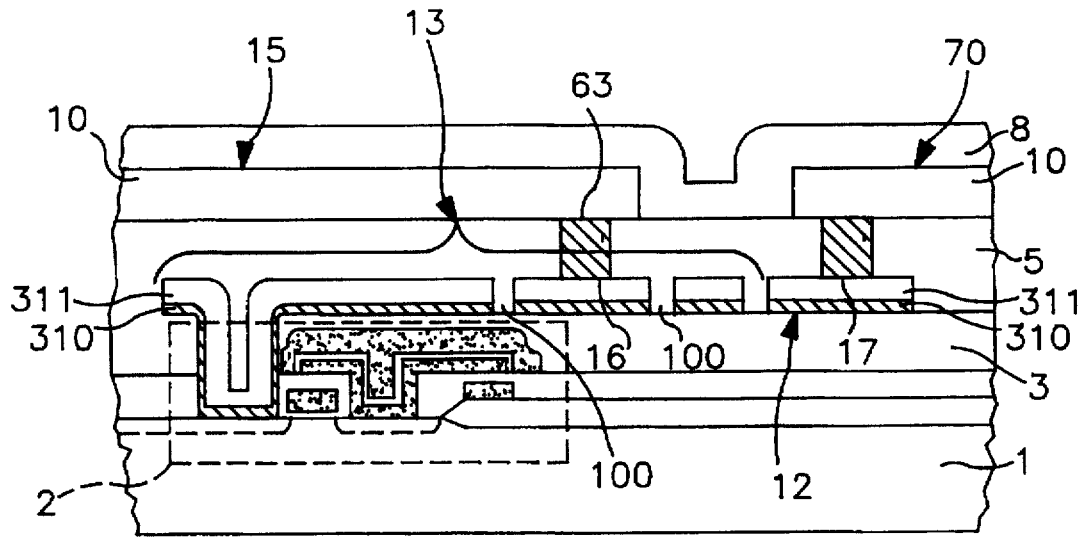

An alternative embodiment of the invention is shown in FIGS. 30(A) and 30(B). In that structure, the through holes 16 and 17 are filled with a different metal 63, for example, tungsten, by selective CVD. In this structure, the insulating barriers 100 are disposed in the wide interconnection layer 13 to control the direction of current flow through the metal in the through hole 16 so that the advantages of the invention already described are achieved. In order to manufacture this structure, the metal 63 in the through holes 16 and 17 is deposited in the holes and on the surface of the film defining the holes. Thereafter, the metal is etched, leaving only the metal within the through holes 16 and 17. This technique is sometimes referred to as the blanket tungsten deposition technique.

Figure 31A:
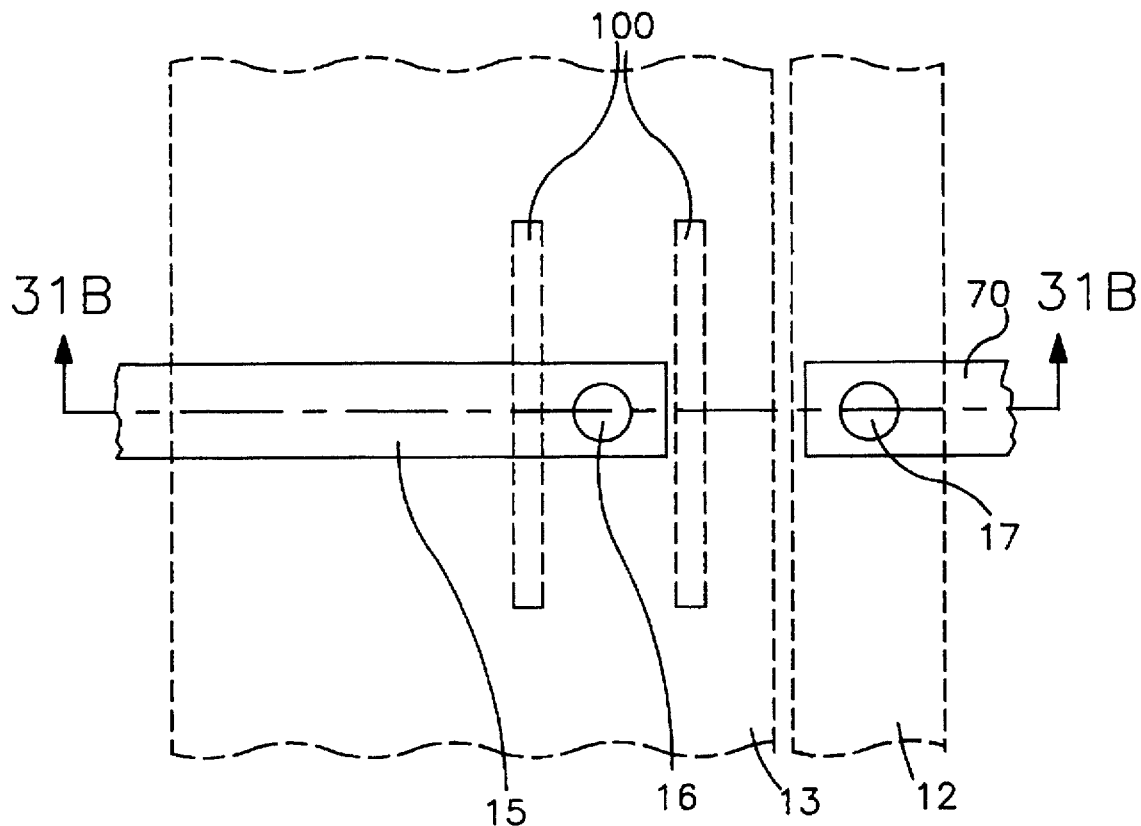
Figure 31B:
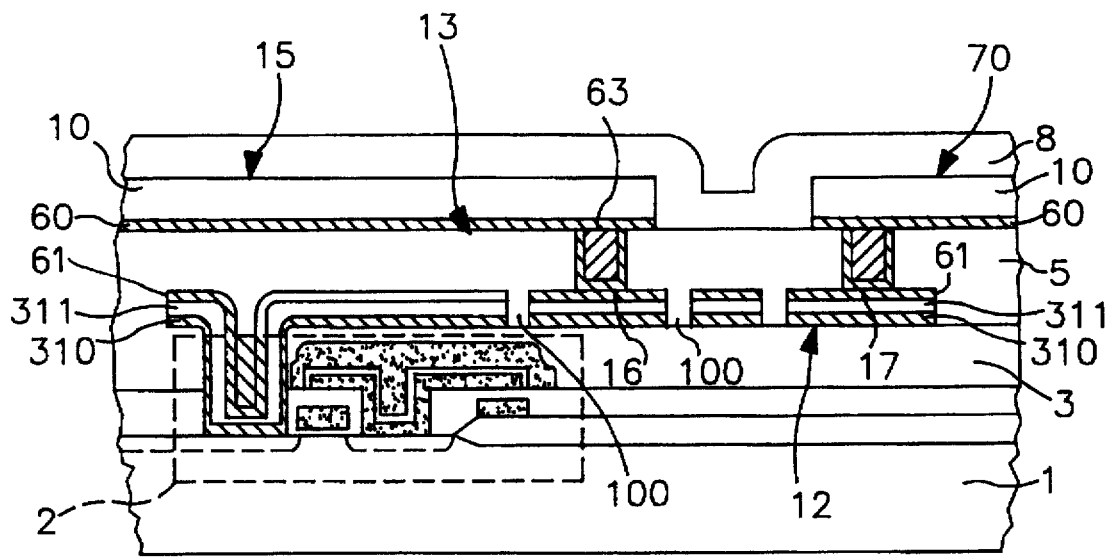

Still another example of an embodiment of the invention is shown in FIGS. 31(A) and 31(B). In this structure, the through holes 16 and 17 contain at least two different materials. Initially, a base film 64 of titanium nitride or of multiple films is deposited before a second film 65, such as tungsten, is deposited to fill the through holes 16 and 17. The second interconnection layer 70 including a base film 60 of titanium nitride or of multiple films makes contact with the metals within the through holes 16 and 17 and is covered by an aluminum alloy film 10.

Figure 32A:
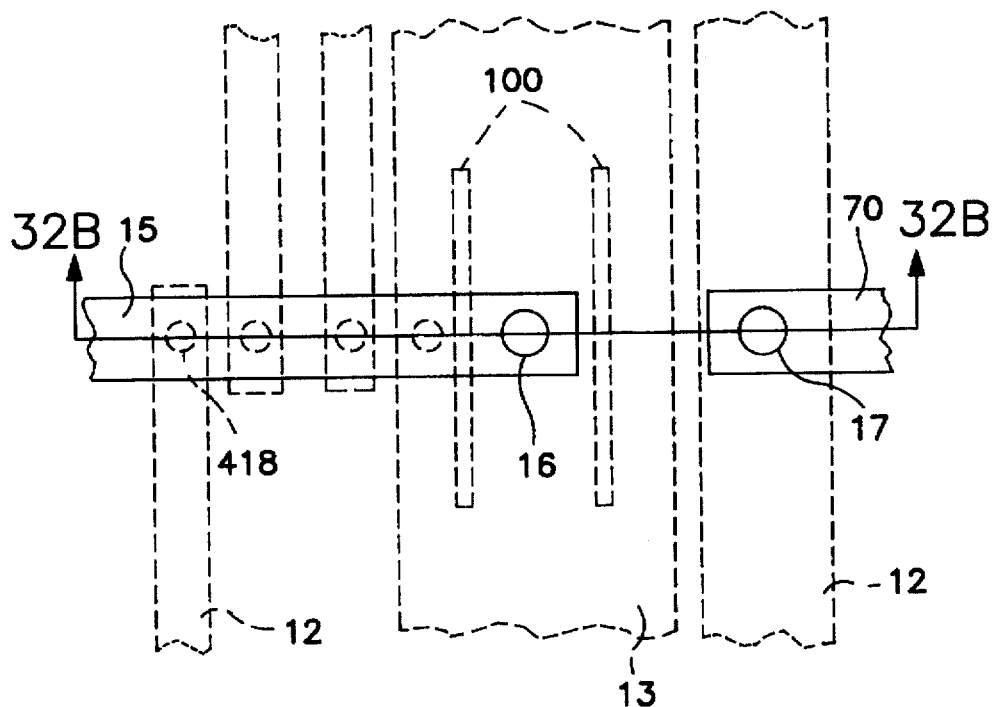
Figure 32B:
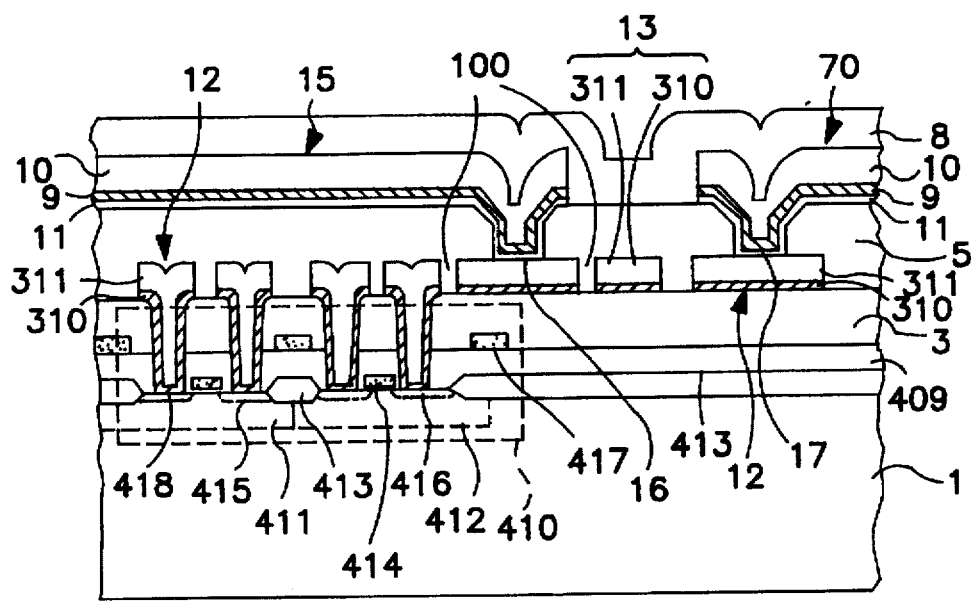

The invention may be applied to numerous multi-level interconnection structures. For example, in FIGS. 32(A) and 32(B), a static random access memory (SRAM) cell 410 includes double well complementary metal oxide semiconductor (CMOS) structures on the silicon substrate 1. The substrate includes a p-type region 411 adjacent to an n-type region 412 and a silicon oxide region 413 at the surface of the substrate isolating regions 411 and 412. N-type regions 415 are formed at spaced apart intervals within the p-type well 411. Gate electrodes 414 are disposed within an insulating film spaced from and between pairs of the p-type regions 415. Polycrystalline silicon interconnections 417 are disposed at spaced apart intervals from the insulating film 409. The first dielectric layer 3 covers the SRAM cell 410. A through hole 418 penetrates the dielectric film 3 and the insulating film 409 to reach the surface of the silicon substrate 1 at an n-type region 415. Alternatively, other contact holes penetrate the first dielectric layer 3 and the insulating film 409 to reach the surface of the silicon substrate 1 at a p-type region 416. The wide interconnection layer 13 is disposed on the first dielectric layer 3 and in the through holes to contact the respective doped regions 415 and 416. The structure interconnecting the first and second interconnection layers 13 and 15 is the same as in FIGS. 1(A) and 1(B). Although embodiments of the invention have been described with respect to DRAM and SRAM cells, the invention can also be used with erasable programmable read only memory cells, electrically erasable programmable read only memory cells, microcomputer circuit elements, CMOS logic circuit elements, and bipolar transistors.

Figure 33A:
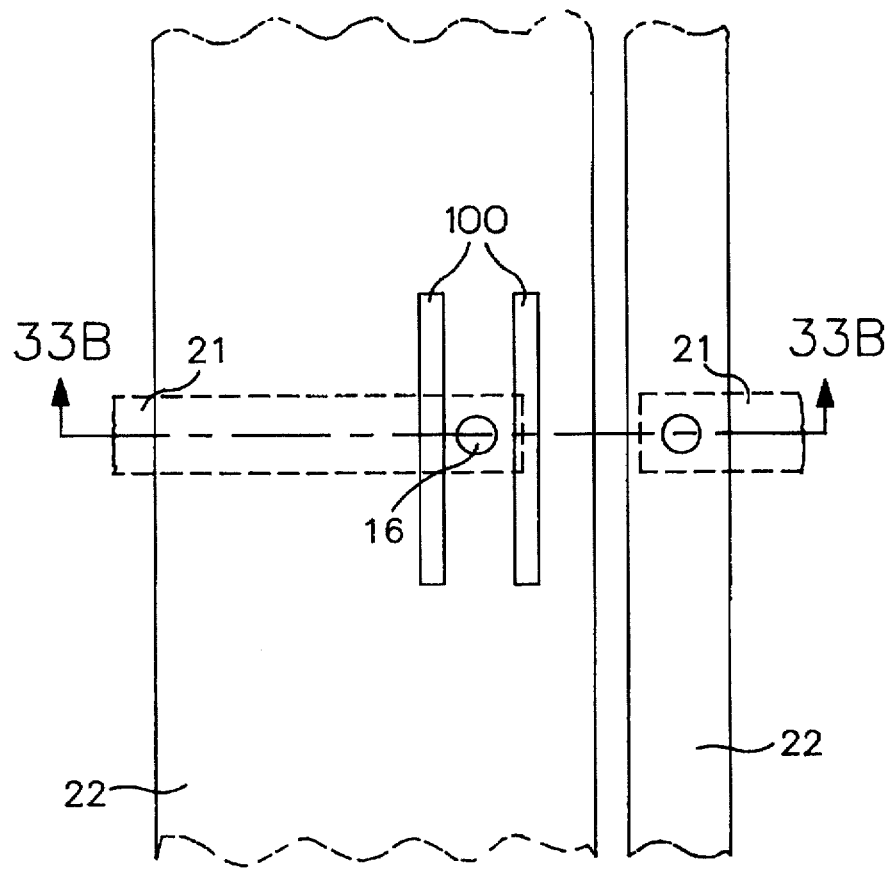
Figure 33B:
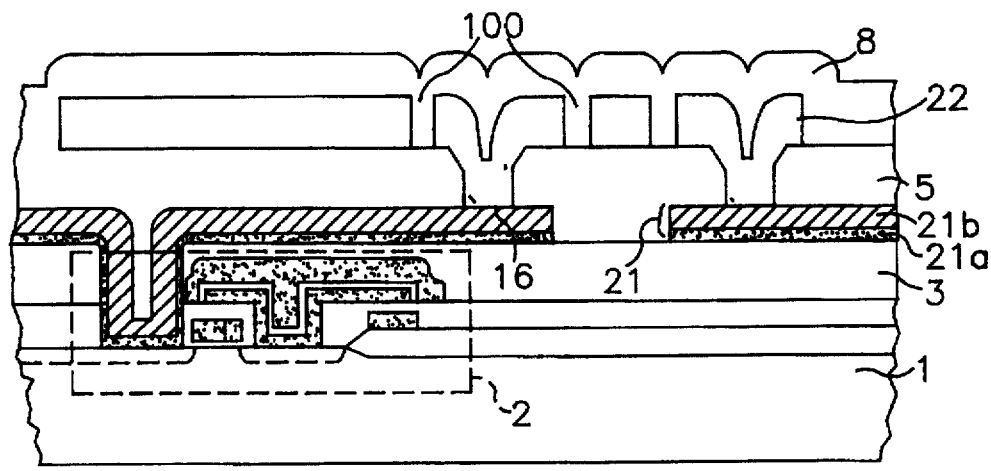
Figure 34A:
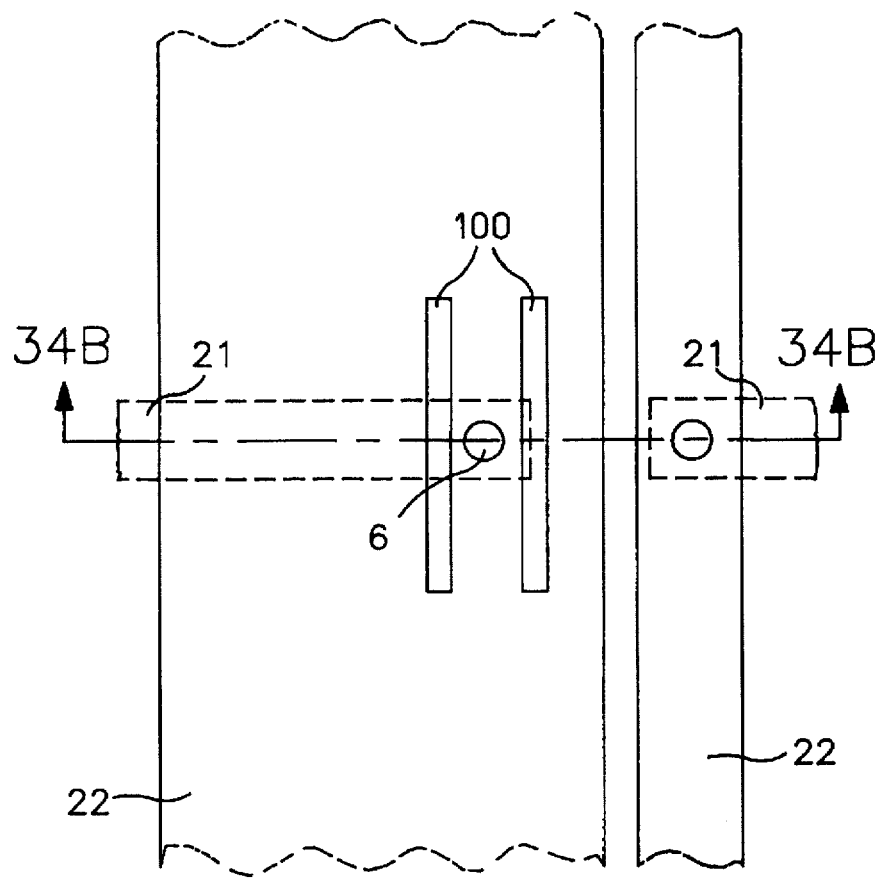
Figure 34B:
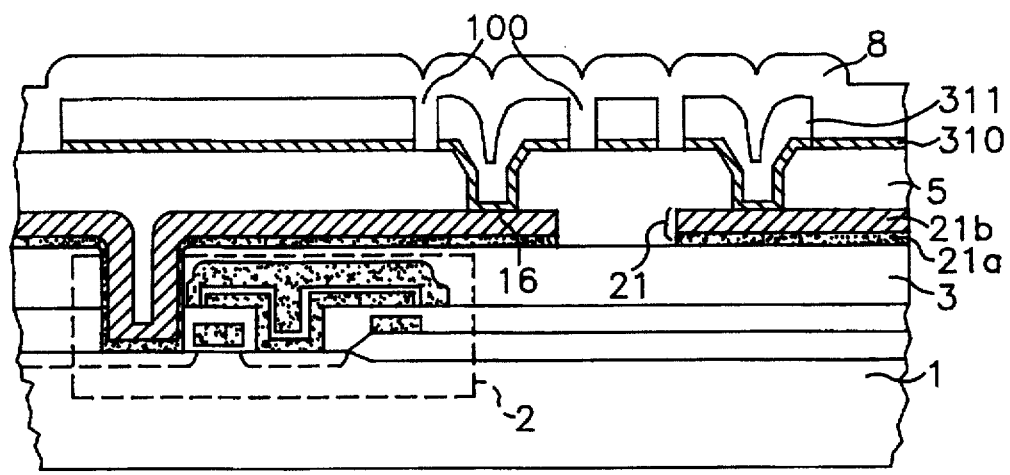
Figure 35A:
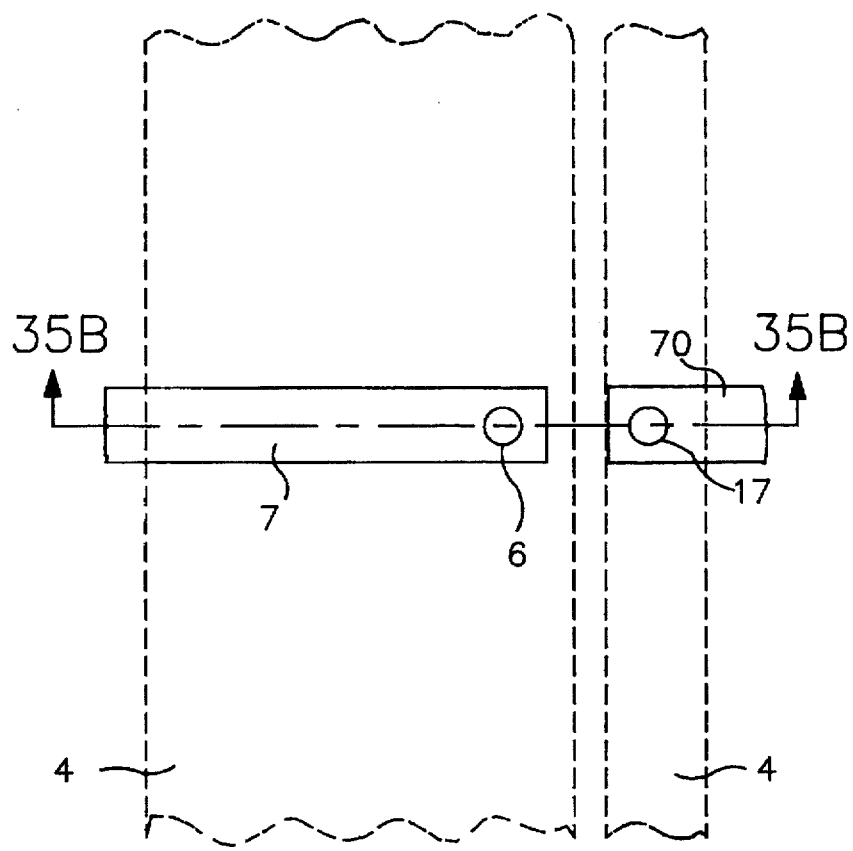
FIGS. 35(A) and 35(B) are plan and cross-sectional views of a conventional multi-level interconnection structure in a semiconductor integrated circuit.
Figure 35B:
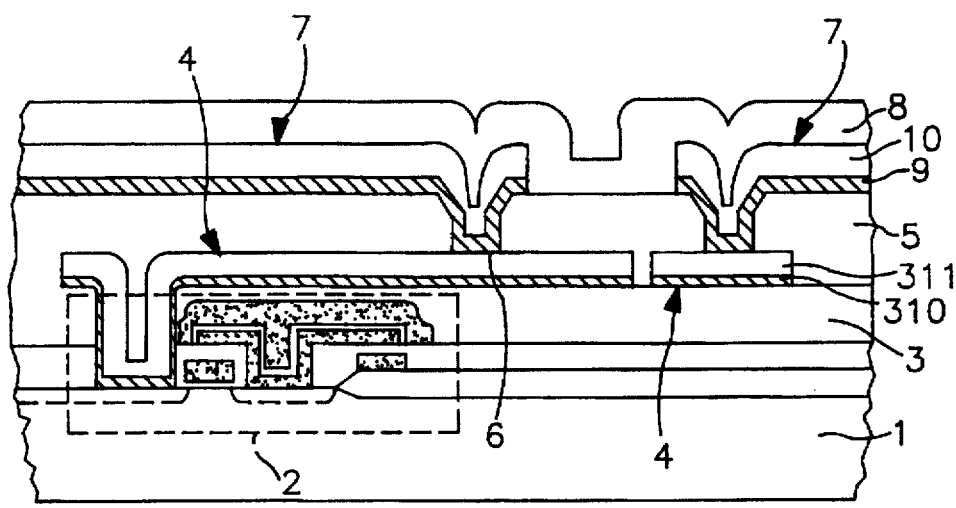

In many of the foregoing examples, the first and second interconnection layers include aluminum films. Generally, when the principal material in each of the first and second interconnection layers is the same, those materials are connected to each other in a through hole with a different material, and the invention can be advantageously used. The principal materials of the interconnection layers may be a highly conductive metal, such as copper, gold, or silver, a refractory metal, such as titanium, molybdenum, tungsten, and tantalum, a silicide of any of the refractory metal films, a nitride, oxide, or oxynitride of any of the refractory metals, or an alloy of at least two of the refractory metals. If the principal materials of the two interconnection layers are different, the problems described in connection with FIGS. 50(A), 50(B), 51(A), and 51(B) may occur. Therefore, in that case, it is desirable to form the insulating barriers to control the direction of current flow within respective interconnection layers to overcome those problems. For example, as shown in FIGS. 33(A) and 33(B), the insulating barriers 100 may be disposed within the relatively wide second interconnection layer 22. In this structure the second interconnection layer 22 may include multiple films, such as a titanium nitride film 310 and an aluminum alloy film 311, which are different from the materials, for example, tungsten silicide and silicon, employed in the first interconnection layer, as illustrated in FIGS. 34(A) and 34(B).

The invention has been described with respect to certain preferred embodiments. Various additions and modifications within the spirit of the invention will occur to those of skill in the art from the foregoing description. Accordingly, the scope of the invention is limited solely by the following claims.

We claim:

1. A semiconductor integrated circuit structure comprising:

a semiconductor substrate;

an electronic element disposed in the substrate;

a first electrically insulating layer disposed on the substrate and the electronic element;

a first electrically conducting interconnection layer electrically connected to the electronic element and disposed at least partly on the first electrically insulating layer;

a second electrically insulating layer disposed on the first electrically conducting interconnection layer;

a second electrically conducting interconnection layer disposed on the second electrically insulating layer; and a through-hole penetrating the second electrically insulating layer to the first electrically conducting interconnection layer, part of the second electrically conducting interconnection layer being disposed within the through-hole and contacting the first electrically conducting interconnection layer wherein the first electrically conducting interconnection layer includes a current barrier comprising at least one opening in the first electrically conducting interconnection layer proximate the through-hole extending through the first electrically conducting interconnection layer to the first electrically insulating layer and filled with part of the second electrically insulating layer, the current barrier in the first electrically conducting interconnection layer constraining current flowing between the first and second electrically conducting interconnection layers to flow around the current barrier.

2. The structure of claim 1 wherein the electronic element is chosen from the group consisting of a DRAM cell, a SRAM cell, and a CMOS structure.

3. The structure of claim 1 wherein at least one of the first and second electrically conducting interconnection layers includes at least two films.

4. The structure of claim 3 wherein one of the films is chosen from the group consisting of TiN and TiW and the other film is an aluminum alloy.

5. The structure of claim 3 wherein at least one of the first and second electrically conducting interconnection layers includes two films of TiN sandwiching an aluminum alloy film.

6. The structure of claim 1 wherein the current barrier includes an opening in the first electrically conducting interconnection layer lying along a straight line.

7. The structure of claim 1 wherein the current barrier includes two openings in the first electrically conducting interconnection layer disposed on opposite sides of the through-hole.

8. The structure of claim 1 wherein the current barrier includes a plurality of spaced apart openings in the first electrically conducting interconnection layer filled with parts of the second electrically insulating layer.

9. The structure of claim 1 wherein the current barrier includes an opening in the first electrically conducting interconnection layer varying in a dimension parallel to the substrate with position along the opening.

10. The structure of claim 1 wherein the current barrier includes an opening in the first electrically conducting interconnection layer having a U-shape on the first electrically conducting interconnection layer and the through-hole is disposed within the U-shape.

11. The structure of claim 1 wherein the current barrier includes an opening in the first electrically conducting interconnection layer having an L-shape on the first electrically conducting interconnection layer and the through-hole is disposed proximate a corner of the L-shape.

12. The structure of claim 1 wherein at least one of the electrically conducting interconnection layers includes a film chosen from the group consisting of copper, gold, silver, titanium, molybdenum, tungsten, tantalum, and silicides, nitrides, oxides, and oxynitrides of titanium, molybdenum, tungsten, and tantalum.

13. The structure of claim 1 including a third electrically insulating layer disposed on the second electrically conducting interconnection layer wherein the second electrically conducting interconnection layer includes a current barrier comprising at least one opening in the second electrically conducting interconnection layer proximate the through-hole, extending through the second electrically conducting interconnection layer to the second electrically insulating layer and filled with part of the third electrically insulating layer, the current barrier in the second electrically conducting interconnection layer constraining current flowing between the first and second electrically conducting interconnection layers to flow around the current barrier in the second electrically conducting interconnection layer.

14. The structure of claim 1 wherein the first and second electrically conducting interconnection layers are formed of different materials.

15. A semiconductor integrated circuit structure comprising:

a semiconductor substrate;

an electronic element disposed in the substrate;

a first electrically insulating layer disposed on the substrate and the electronic element;

a first electrically conducting interconnection layer electrically connected to the electronic element and disposed at least partly on the first electrically insulating layer;

a second electrically insulating layer disposed on the first electrically conducting interconnection layer;

a second electrically conducting interconnection layer disposed on the second electrically insulating layer;

a first through-hole penetrating the second electrically insulating layer to the first electrically conducting interconnection layer, part of the second interconnection layer being disposed within the first through-hole and contacting the first electrically conducting interconnection layer;

a third electrically insulating layer disposed on the second electrically conducting interconnection layer;

a third electrically conducting interconnection layer disposed on the third electrically insulating layer;

a second through-hole penetrating the third electrically insulating layer to the second electrically conducting interconnection layer, part of the third electrically conducting interconnection layer being disposed within the second through-hole contacting the second electrically conducting interconnection layer; and a fourth electrically insulating layer disposed on the third electrically conducting interconnection layer wherein the third electrically conducting interconnection layer includes a current barrier comprising at least one opening in the third electrically conducting interconnection layer proximate the second through-hole, extending through the third electrically conducting interconnection layer to the third electrically insulating layer, filled with part of the fourth electrically insulating layer, the current barrier in the third electrically conducting interconnection layer constraining current flowing between the second and third electrically conducting interconnection layers to flow around the current barrier.

16. The structure of claim 15 wherein the electronic element is chosen from the group consisting of a DRAM cell, a SRAM cell, and a CMOS structure.

17. The structure of claim 15 wherein at least one of the first, second, and third electrically conducting interconnection layers includes at least two films.

18. The structure of claim 17 wherein one of the films is chosen from the group consisting of TiN and TiW and the other film is an aluminum alloy.

19. The structure of claim 15 wherein at least one of the first, second, and third electrically conducting interconnection layers includes two films of TiN sandwiching an aluminum alloy film.

20. The structure of claim 15 wherein at least two of the first, second, and third electrically conducting interconnection layers are formed of different materials.

21. A semiconductor integrated circuit structure comprising:

a semiconductor substrate;

an electronic element disposed in the substrate;

a first electrically insulating layer disposed on the substrate and the electronic element;

a first electrically conducting interconnection layer electrically connected to the electronic element and disposed at least partly on the first electrically insulating layer;

a second electrically insulating layer disposed on the first electrically conducting interconnection layer;

a second electrically conducting interconnection layer disposed on the second electrically insulating layer; and a through-hole penetrating the second electrically insulating layer to the first electrically conducting interconnection layer, part of the second interconnection layer being disposed within the through-hole and contacting the first electrically conducting interconnection layer;

a third electrically insulating layer disposed on the second electrically conducting interconnection layer wherein the second electrically conducting interconnection layer includes a current barrier comprising at least one opening in the second electrically conducting interconnection layer proximate the through-hole, extending through the second electrically conducting interconnection layer to the second electrically insulating layer and filled with part of the third electrically insulating layer, the current barrier in the second electrically conducting interconnection layer constraining current flowing between the first and second electrically conducting interconnection layers to flow around the current barrier.

22. The structure of claim 21 wherein at least one of the first and second electrically conducting interconnection layers includes at least two films.

23. The structure of claim 22 wherein one of the films is chosen from the group consisting of TiN and TiW and the other film is an aluminum alloy.

24. The structure of claim 22 wherein at least one of the first and second electrically conducting interconnection layers includes two films of TiN sandwiching an aluminum alloy film.

25. The structure of claim 21 wherein the current barrier includes an opening in the second electrically conducting interconnection layer lying along a straight line.

26. The structure of claim 21 wherein the current barrier includes two openings in the second electrically conducting interconnection layer disposed on opposite sides of the through-hole.

27. The structure of claim 21 wherein the current barrier includes a plurality of spaced apart openings in the second electrically conducting interconnection layer filled with parts of the third electrically insulating layer.

28. The structure of claim 21 wherein the current barrier includes an opening in the second electrically conducting interconnection layer varying in a dimension parallel to the substrate with position along the opening.

29. The structure of claim 21 wherein the current barrier includes an opening in the second electrically conducting interconnection layer having a U-shape on the second electrically conducting interconnection layer and the through-hole is disposed within the U-shape.

30. The structure of claim 21 wherein the current barrier includes an opening in the second electrically conducting interconnection layer having an L-shape on the second electrically conducting interconnection layer and the through-hole is disposed proximate a corner of the L-shape.

31. The structure of claim 21 wherein at least one of the electrically conducting interconnection layers includes a film chosen from the group consisting of copper, gold, silver, titanium, molybdenum, tungsten, tantalum, and silicides, nitrides, oxides, and oxynitrides of titanium, molybdenum, tungsten, and tantalum.

* * * * *